United States Patent
Terasaki et al.

(10) Patent No.: US 9,530,717 B2
(45) Date of Patent: Dec. 27, 2016

(54) BONDED BODY AND POWER MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/913,648

(22) PCT Filed: Aug. 18, 2014

(86) PCT No.: PCT/JP2014/071525
§ 371 (c)(1),
(2) Date: Feb. 22, 2016

(87) PCT Pub. No.: WO2015/029812
PCT Pub. Date: Mar. 5, 2015

(65) Prior Publication Data
US 2016/0276244 A1    Sep. 22, 2016

(30) Foreign Application Priority Data

Aug. 26, 2013 (JP) .................................. 2013-175001
Jul. 15, 2014 (JP) .................................. 2014-145115

(51) Int. Cl.
*H01L 23/373* (2006.01)
*B23K 35/02* (2006.01)
(Continued)

(52) U.S. Cl.
CPC ....... *H01L 23/3735* (2013.01); *B23K 35/0222* (2013.01); *H01L 21/4846* (2013.01);
(Continued)

(58) Field of Classification Search
CPC ......... H05K 1/092; H05K 3/244; H05K 1/095
(Continued)

(56) References Cited

U.S. PATENT DOCUMENTS

2010/0247955 A1    9/2010   Takahashi et al.

FOREIGN PATENT DOCUMENTS

| CN | 101345141 A | 1/2009 |
| CN | 101987402 A | 3/2011 |

(Continued)

OTHER PUBLICATIONS

International Search Report mailed Nov. 18, 2014, issued for PCT/JP2014/071525 and English translation thereof.
(Continued)

*Primary Examiner* — Timothy Thompson
*Assistant Examiner* — Stanley Tso
(74) *Attorney, Agent, or Firm* — Locke Lord LLP

(57) ABSTRACT

The bonded body of the present invention includes: a ceramic member made of ceramics; and a Cu member which is made of Cu or a Cu alloy and bonded to the ceramic member through a Cu—P—Sn-based brazing filler material and a Ti material, wherein a Cu—Sn layer, which is positioned close to the ceramic member and in which Sn forms a solid solution with Cu, and an intermetallic compound layer which is positioned between the Cu member and the Cu—Sn layer and contains P and Ti, are formed at a bonded interface between the ceramic member and the Cu member.

10 Claims, 15 Drawing Sheets

(51) Int. Cl.
*H01L 23/473* (2006.01)
*H01L 23/15* (2006.01)
*H01L 21/48* (2006.01)
*H01L 23/498* (2006.01)

(52) U.S. Cl.
CPC .......... *H01L 21/4882* (2013.01); *H01L 23/15* (2013.01); *H01L 23/473* (2013.01); *H01L 23/49838* (2013.01); *H01L 23/49866* (2013.01)

(58) Field of Classification Search
USPC ........................................................ 174/257
See application file for complete search history.

(56) References Cited

FOREIGN PATENT DOCUMENTS

| | | |
|---|---|---|
| CN | 105190869 A | 12/2015 |
| JP | 04-295065 A | 10/1992 |
| JP | 10-102167 A | 4/1998 |
| JP | 10-286666 A | 10/1998 |
| JP | 2001-085571 A | 3/2001 |
| JP | 2002-110875 A | 4/2002 |
| JP | 2008-221290 A | 9/2008 |
| JP | 4375730 B2 | 12/2009 |
| JP | 2010-098059 A | 4/2010 |
| JP | 2013-098387 A | 5/2013 |
| KR | 10-2012-0120020 A | 11/2012 |
| TW | 200523058 A | 7/2005 |
| TW | 200625703 A | 7/2006 |
| TW | 200802744 A | 1/2008 |
| TW | 201322385 A | 6/2013 |
| WO | 2005/098942 A1 | 10/2005 |

OTHER PUBLICATIONS

Office Action mailed Jun. 22, 2016, issued for the Taiwanese patent application No. 103128292 and English translation of Search Report.
Office Action mailed Jun. 24, 2016, issued for the Chinese patent application No. 201480041130.8 and English translation thereof.
Notice of Allowance mailed Aug. 11, 2016, issued for the Korean patent application No. 10-2016-7001805 and English translation thereof.

BONDED BODY AND POWER MODULE SUBSTRATE

TECHNICAL FIELD

The invention relates to a bonded body in which a ceramic member is bonded to a Cu member, and a power module substrate in which a circuit layer is formed on one surface of a ceramic substrate.

Priority is claimed on Japanese Patent Application No. 2013-475001, filed Aug. 26, 2013, and Japanese Patent Application No. 2014-145115, filed Jul. 15, 2014, the contents of which are incorporated herein by reference.

BACKGROUND ART

Semiconductor devices such as an LED and a power module have a structure which semiconductor elements are bonded to an upper surface of a circuit layer made of a conductive material.

A high-power control power semiconductor element used to control wind power generation systems and electric vehicles such as electric automobiles radiates a large amount of heat. For this reason, in the related art, a power module substrate, in which a metal plate with superior electrical conductivity as a circuit layer is bonded to one surface of a ceramic substrate made of aluminum nitride (AlN) or the like, is widely used as a substrate on which such power semiconductor elements are mounted. In another type of power module substrate, a metal plate as a metal layer may be bonded to the other surface of the ceramic substrate.

A power module substrate disclosed in PTL 1 has a structure in which a circuit layer is formed by bonding a Cu foil (Cu member) to one surface of a ceramic substrate (ceramic member). The power module substrate s formed by bonding the Cu foil to the ceramic substrate through the heating of the Cu foil which is disposed on the one surface of the ceramic substrate with a Cu—Mg—Ti brazing filler material interposed between the Cu foil and the ceramic substrate.

CITATION LIST

Patent Literature

[PTL 1] Japanese Patent No. 4375730

SUMMARY OF INVENTION

Technical Problem

As disclosed in PTL 1, when the ceramic substrate and the Cu foil are bonded to each other through the Cu—Mg—Ti brazing filler material, an intermetallic compound containing Cu, Mg, or Ti is formed in the vicinity of the ceramic substrate.

Since the intermetallic compound formed in the vicinity of the ceramic substrate is rigid, when the power module substrate undergoes a thermal cycle, thermal stress generating in the ceramic substrate is increased, and cracking is likely to occur in the ceramic substrate, which is a problem.

In addition, if the rigid intermetallic compound is formed in the vicinity of the ceramic substrate when the circuit layer is bonded to the ceramic substrate, the bonding rate between the ceramic substrate and the circuit layer is decreased, and sufficient bonding therebetween cannot be obtained, which is a problem.

The present invention is made in light of these problems, and an object of the invention is to provide a bonded body and a power module substrate in which a ceramic member and a Cu member can be sufficiently bonded to each other, and when the bonded body and the power module substrate undergo a thermal cycle, the occurrence of cracking in the ceramic member can be limited.

Solution to Problem

According to a first aspect of the present invention, in order to solve these problems, there is provided a bonded body including: a ceramic member made of ceramics; and a Cu member which is made of Cu or a Cu alloy and bonded to the ceramic member through a Cu—P—Sn-based brazing filler material and a Ti material, in which a Cu—Sn layer, which is positioned close to the ceramic member and in which Sn forms a solid solution with Cu, and an intermetallic compound layer which is positioned between the Cu member and the Cu—Sn layer and contains P and Ti, are firmed at a bonded interface between the ceramic member and the Cu member.

In the bonded body according to the first aspect of the present invention, P contained in the Cu—P—Sn-based brazing filler material at the bonded interface between the ceramic member and the Cu member is drawn into the intermetallic compound layer formed close to the Cu member. Accordingly, the Cu—Sn layer without an intermetallic compound containing P or with a very small amount of an intermetallic compound containing P is formed close to the ceramic member. That is, since a rigid intermetallic compound is not formed in the vicinity of the ceramic member, it is possible to reduce thermal stress generating in the ceramic member when the bonded body undergoes a thermal cycle. As a result, it is possible to limit the occurrence of cracking in the ceramic member.

Since a rigid intermetallic compound is not formed in the vicinity of the ceramic member at the bonded interface between the ceramic member the Cu member, the bonding rate between the ceramic member and the Cu member is improved, and the ceramic member and the Cu member are sufficiently bonded to each other.

The intermetallic compound layer is preferably formed in a range of 0.1 μm to 100 μm from the interface between the ceramic member and the Cu—Sn layer.

Since the intermetallic compound layer is formed in a range of 0.1 μm to 100 μm from the bonded interface between the ceramic member and the Cu—Sn layer, a rigid intermetallic compound is not formed in the vicinity of the ceramic member, and it is possible to reliably limit the occurrence of cracking in the ceramic member, even though the bonded body undergoes a thermal cycle. As described above, since a rigid intermetallic compound is not formed in the vicinity of the ceramic member, it is possible to reliably improve the bonding rate between the ceramic member and the Cu member.

According to a second aspect of the present invention, there is provided a power module substrate including the above-mentioned bonded body, in which the substrate further includes: a ceramic substrate formed of the ceramic member; and a circuit layer formed by bonding a Cu foil formed of the Cu member to a first surface of the ceramic substrate through the Cu—P—Sn-based brazing filler material. A Cu—Sn layer, which is positioned close to the ceramic substrate and in which Sn forms a solid solution with Cu, and an intermetallic compound layer which is positioned between the circuit layer and the Cu—Sn layer and contains P and Ti, are formed at a bonded interface between the ceramic substrate and the circuit layer.

In the power module substrate according to the second aspect of the present invention, P contained in the Cu—P—Sn-based brazing filler material is drawn into the intermetallic compound layer formed close to the circuit layer at the bonded interface between the ceramic substrate and the circuit layer. Accordingly, the Cu—Sn layer without an intermetallic compound containing P or with a very small amount of an intermetallic compound containing P is formed close to the ceramic substrate. That is, since a rigid intermetallic compound is not formed in the vicinity of the ceramic substrate, it is possible to reduce thermal stress generating in the ceramic substrate when the power module substrate undergoes a thermal cycle. As a result, it is possible to limit the occurrence of cracking in the ceramic substrate.

Since a rigid intermetallic compound is not formed in the vicinity of the ceramic substrate at the bonded interface between the ceramic substrate and the circuit layer, the bonding rate between the ceramic substrate and the circuit layer is improved, and the ceramic substrate and the circuit layer are sufficiently bonded to each other.

In the power module substrate according to the second aspect of the present invention, a metal layer is preferably formed on a second surface of the ceramic substrate.

Since the metal layer is formed on the second surface of the ceramic substrate, the power module substrate is capable of efficiently dissipating heat from a ceramic substrate side through the metal layer.

It is preferable that the metal layer is formed by bonding the Cu foil made of Cu or a Cu alloy to the second surface of the ceramic substrate through a Cu—P—Sn-based brazing filler material and a Ti material, and that a Cu—Sn layer, which is positioned close to the ceramic substrate and in which Sn forms a solid solution with Cu, and an intermetallic compound layer which is positioned between the metal layer and the Cu—Sn layer and contains P and Ti are formed at a bonded interface between the ceramic substrate and the metal layer.

In this case, P contained in the Cu—P—Sn-based brazing filler material at the bonded interface between the ceramic substrate and the metal layer is drawn into the intermetallic compound layer formed close to the metal layer. Accordingly, the Cu—Sn layer without an intermetallic compound containing P or with a very small amount of an intermetallic compound containing P is formed close to the ceramic substrate. That is, since a rigid intermetallic compound is not formed in the vicinity of the ceramic substrate, it is possible to reduce thermal stress generating in the ceramic substrate when the power module substrate undergoes a thermal cycle. As a result, it is possible to limit the occurrence of cracking in the ceramic substrate.

Since a rigid intermetallic compound is not formed in the vicinity of the ceramic substrate at the bonded interface between the ceramic substrate and the metal layer, the bonding rate between the ceramic substrate and the metal layer is improved and the ceramic substrate and the metal layer are sufficiently bonded to each other.

The metal layer may be made of Al or an Al alloy.

In this case, the metal layer made of Al or an Al alloy has low strength, and thus it is possible to reduce thermal stress generating in the ceramic substrate when the power module substrate undergoes a thermal cycle.

Advantageous Effects of Invention

According to the present invention, it is possible to provide the bonded body and the power module substrate in which the ceramic member and the Cu member can be sufficiently bonded to each other, and when the bonded body and the power module substrate undergo a thermal cycle, the occurrence of cracking in the ceramic member can be limited.

DESCRIPTION OF EMBODIMENTS

First Embodiment

Hereinafter, embodiments of the present invention will be described with reference to the accompanying drawings. First, a first embodiment of the present invention will be described.

Figure 1:
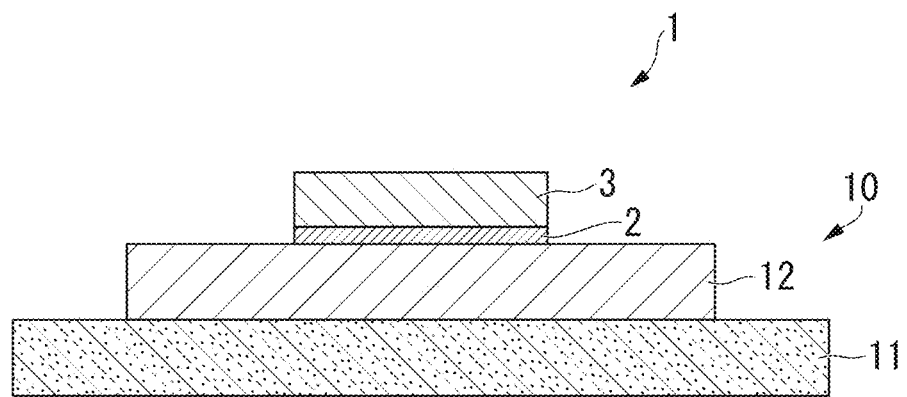
FIG. 1 is a schematic view of a power module in which a power module substrate is used in a first embodiment of the present invention.

A bonded body in the embodiment is a power module substrate 10 in which a ceramic substrate 11 formed of a ceramic member, and a Cu foil 22 (a circuit layer 12) formed of a Cu member, are bonded to each other. FIG. 1 shows a power module 1 including the power module substrate 10 in the embodiment.

The power module 1 includes the power module substrate 10 on which the circuit layer 12 is provided, and a semiconductor element 3 that is bonded to one surface (an upper surface in FIG. 1) of the circuit layer 12 through a bonding layer 2.

Figure 2:
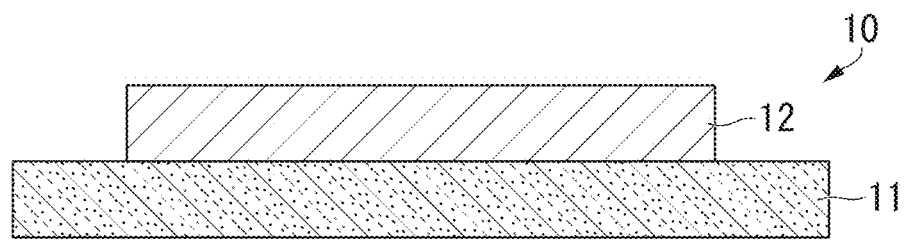
FIG. 2 is a schematic view of the power module substrate in the first embodiment of the present invention.

As shown in FIG. 2, the power module substrate 10 includes the ceramic substrate 11 including a first surface and a second surface, and the circuit layer 12 that is provided on the first surface (an upper surface in FIG. 2) which is one surface of the ceramic substrate 11.

The ceramic substrate 11 is made of high-insulation ceramics such as aluminum nitride (AlN), silicon nitride ($Si_3N_4$), and alumina ($Al_2O_3$). In the embodiment, the ceramic substrate 11 is made of aluminum nitride (AlN) having good heat radiation. The thickness of the ceramic substrate 11 is set to be in a range of 0.2 mm to 1.5 mm. In the embodiment, the thickness is set to 0.635 mm.

The circuit layer 12 is formed by bonding an electrically-conductive metal plate (the Cu foil 22) made of Cu or a Cu alloy to the first surface of the ceramic substrate 11 through a Cu—P—Sn-based brazing filler material and a Ti material. The Cu foil 22 may be made of oxygen-free copper, deoxidized copper, tough pitch copper, or the like. In the embodiment, the Cu foil 22 is made of oxygen-free copper. The thickness of the Cu foil 22 is preferably set to be in a range of 0.1 mm to 1.0 mm. In the embodiment, the thickness is set to 0.6 mm.

Specific examples of the Cu—P—Sn-based brazing filler material include a Cu—P—Sn brazing filler material, a Cu—P—Sn—Ni-based brazing filler material, a Cu—P—Sn—Zn-based brazing filler material, a Cu—P—Sn—Mn-based brazing filler material, and a Cu—P—Sn—Cr-based brazing filler material. The Cu—P—Sn-based brazing filler material preferably contains 3 mass % to 10 mass % of P, and 0.5 mass % to 25 mass % of Sn. In the embodiment, a Cu—P—Sn—Ni brazing filler material 24 is used as the Cu—P—Sn-based brazing filler material. The Cu—P—Sn-based brazing filler material has a melting point of 710° C. or less. The Cu—P—Sn—Ni brazing filler material 24 used in the embodiment has a inciting point of 580° C. In the embodiment, the solidus temperature of the Cu—P—Sn-based brazing filler material is used as the melting point.

Figure 5:
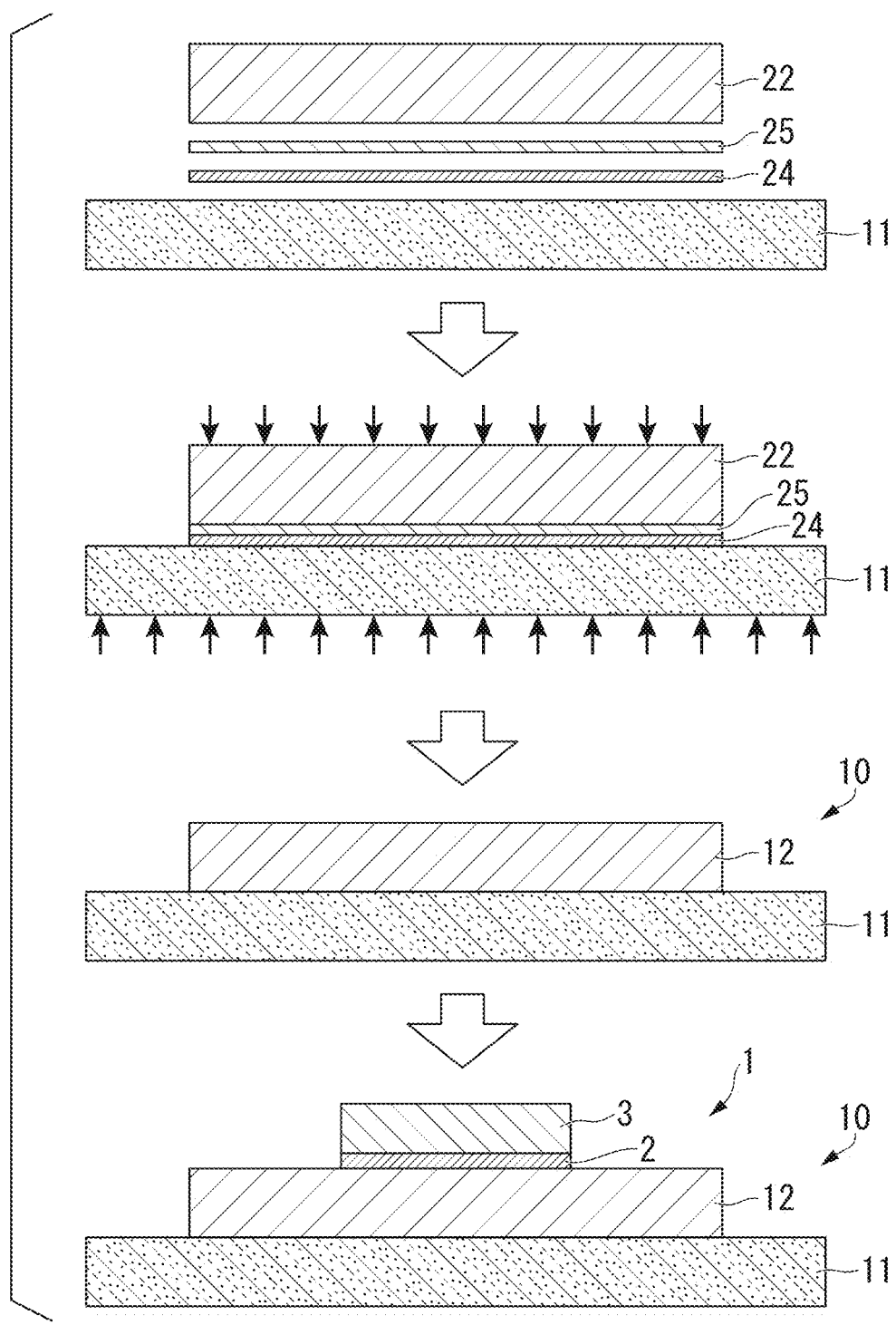
FIG. 5 shows schematic views showing the method of producing the power module substrate and the power module in the first embodiment of the present invention.

In the embodiment, the circuit layer 12 is formed by bonding the Cu foil 22 to the ceramic substrate 11 through the heating of the Cu—P—Sn—Ni brazing filler material 24, a Ti material 25, and the Cu foil 22 made of oxygen-free copper, which are laminated on the first surface of the ceramic substrate 11 (refer to FIG. 5).

A ceramic substrate 11 side of the circuit layer 12 has a structure in which Sn diffuses through Cu.

The thickness of the circuit layer 12 is set to be in a range of 0.1 mm to 1.0 mm. In the embodiment, the thickness is set to 0.6 mm.

Figure 3:
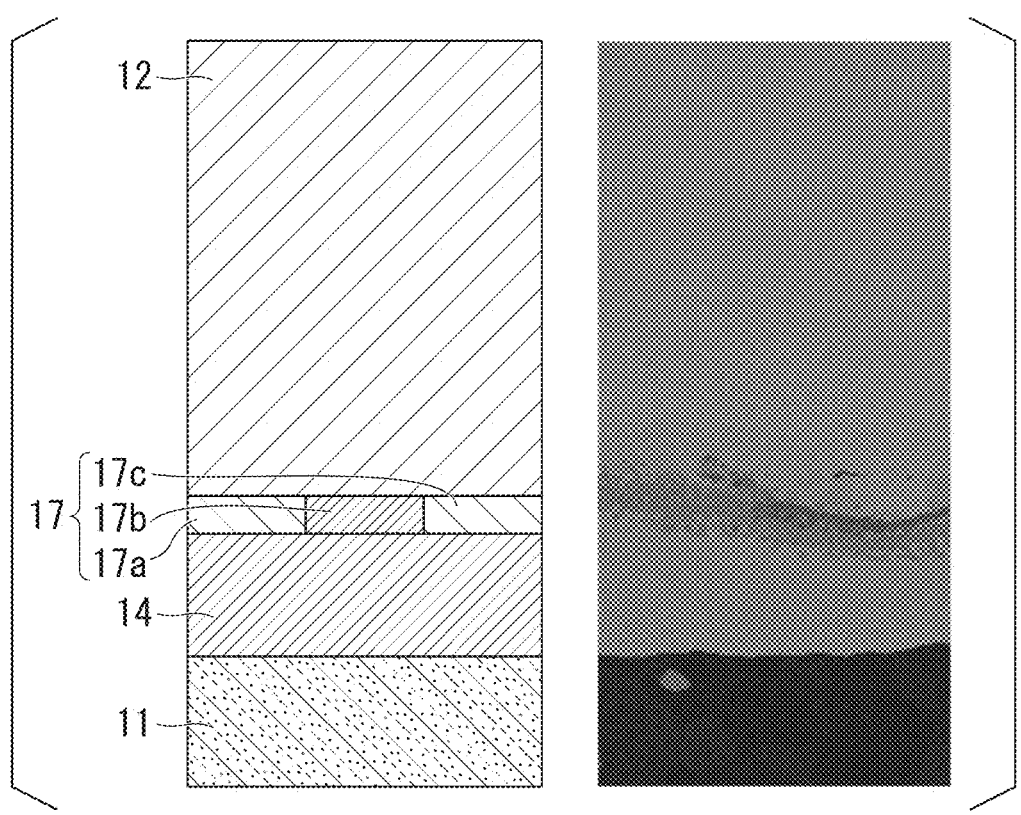
FIG. 3 is an electron micrograph obtained by capturing an image of the section of the bonded interface between a circuit layer and a ceramic substrate shown in FIG. 2, and a schematic view thereof.

FIG. 3 shows an electron micrograph of the bonded interface between the ceramic substrate 11 and the circuit layer 12, and a schematic view thereof. As shown in FIG. 3, a Cu—Sn layer 14 and an intermetallic compound layer 17 are formed at the bonded interface between the ceramic substrate 11 and the circuit layer 12. The Cu—Sn layer 14 is positioned close to the ceramic substrate 11, and the intermetallic compound layer 17 is positioned between the circuit layer 12 and the Cu—Sn layer 14, and contains P, Ni, and Ti.

Cu—Sn layer 14 is a layer in which Sn forms a solid solution with Cu. P and Ni contained in the Cu—P—Sn—Ni brazing filler material 24 is drawn into the intermetallic compound layer 17 formed close to the circuit layer 12, and thereby the Cu—Sn layer 14 is formed. The thickness of the Cu—Sn layer 14 may be set to be in a range of 0.1 μm to 140 μm.

P and Ni contained in the Cu—P—Sn—Ni brazing filler material 24 are combined with Ti contained in the Ti material 25, and thereby the intermetallic compound layer 17 is formed. The intermetallic compound layer 17 includes at least one or more of a P—Ni—Ti phase 17a, a P—Ti phase 17b, and a Cu—Ni—Ti phase 17c. In the embodiment, as shown in FIG. 3, the intermetallic compound layer 17 includes the P—Ni—Ti phase 17a, the P—Ti phase 17b, and the Cu—Ni—Ti phase 17c.

That is, the intermetallic compound layer 17 has a layered structure of the P—Ni—Ti phase 17a, the P—Ti phase 17b, and the Cu—Ni—Ti phase 17c.

The intermetallic compound layer 17 is formed in a range of 0.1 μm to 100 μm from the interface between the ceramic substrate 11 and the Cu—Sn layer 14. The intermetallic compound layer 17 is preferably formed in a range of 1.0 μm to 50 μm from the interface between the ceramic substrate 11 and the Cu—Sn layer 14. The thickness of the intermetallic compound layer 17 may be in a range of 0.5 μm to 6 μm.

The semiconductor element 3 is made of a semiconductor material such as Si. The semiconductor element 3 and the circuit layer 12 are bonded to each other through the bonding layer 2.

The bonding layer 2 is made of a Sn—Ag-based solder material, a Sn—In-based solder material, a Sn—Ag—Cu-based solder material, or the like.

Figure 4:
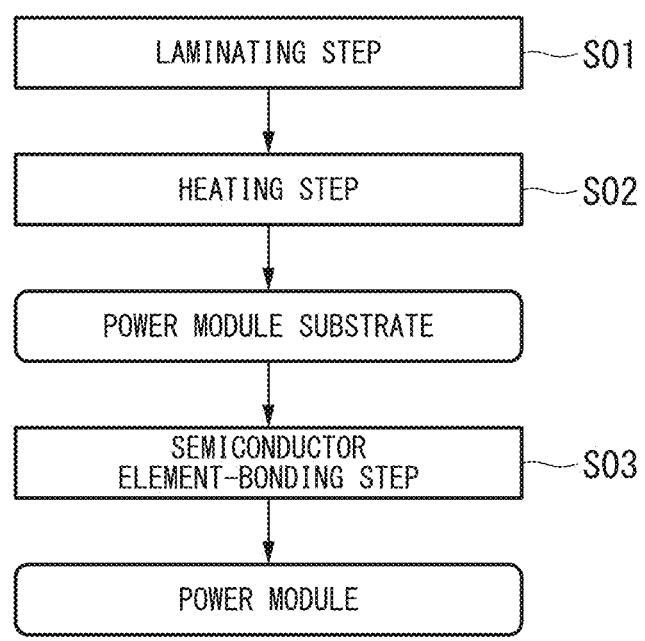
FIG. 4 is a flowchart showing a method of producing the power module substrate and the power module in the first embodiment of the present invention.

Hereinafter, a method of producing the power module substrate 10 and the power module 1 in the embodiment will be described with reference to the flowchart in FIG. 4, and FIG. 5.

First, as shown in FIG. 5, the Cu—P—Sn—Ni brazing filler material 24, the Ti material 25, and the Cu foil 22 which forms into the circuit layer 12 are sequentially laminated on the first surface (an upper surface in FIG. 5) which is one surface of the ceramic substrate 11 (laminating step S01). That is, between the ceramic substrate 11 and the Cu foil 22, the Cu—P—Sn—Ni brazing filler material 24 is disposed close to the ceramic substrate 11, and the Ti material 25 as a Ti material is disposed close to the Cu foil 22.

In the embodiment, the compositions of the Cu—P—Sn—Ni brazing filler material 24 are Cu, 7 mass % of P, 15 mass % of Sn, and 10 mass % of Ni. The Cu—P—Sn—Ni brazing filler material 24 is a foil material, and the thickness thereof is in a range of 5 μm to 150 μm.

The thickness of the Ti material 25 is in a range of 0.1 μm to 5 μm. When the thickness of the Ti material 25 is in a range of 0.1 μm to less than 0.5 μm, the Ti material 25 is preferably film-formed by vapor deposition or spattering. When the thickness is in a range of 0.5 μm to 5 μm, a foil material is preferably used as the Ti material 25. The thickness of the Ti material 25 preferably is in a range of 0.5 μm to 5 μm, and more preferably is in a range of 1.0 μm to 4.0 μm. The purity of the Ti material 25 is 99.4% or greater. In the embodiment, Ti foil with a thickness of 2.0 μm and a purity of 99.8% is used as the Ti material 25.

Subsequently, the ceramic substrate 11, the Cu—P—Sn—Ni brazing filler material 24, the Ti material 25, and the Cu foil 22 are placed into and heated in a vacuum heating furnace while being pressurized (at a pressure of 1 kgf/cm$^2$ to 35 kgf/cm$^2$ (0.10 MPa to 3.43 MPa)) in a laminating direction (heating step S02). In the embodiment, the internal pressure of the vacuum heating furnace is set to be in a range of $10^{-6}$ Pa to $10^{-3}$ Pa, the heating temperature is set to be in a range of 600° C. to 650° C., and the heating time is set to be in a range of 30 minutes to 360 minutes.

In the heating step S02, the Cu—P—Sn—Ni brazing filler material 24 is melted to form a liquid phase, the Ti material 25 is melted into the liquid phase, and the liquid phase is solidified. Thereby, the ceramic substrate 11 and the Cu foil 22 are bonded to each other. At this time, P and Ni contained in the Cu—P—Sn—Ni brazing filler material 24 are combined with Ti in the Ti material 25. Therefore, the intermetallic compound layer 17 formed of at least one or more of the P—Ni—Ti phase 17a, the P—Ti phase 17b, and the Cu—Ni—Ti phase 17c is formed. The Cu—Sn layer 14 without an intermetallic compound containing P and Ni or with a very small amount of an intermetallic compound containing P and Ni is formed close to the ceramic substrate 11.

During bonding, Sn diffuses to the circuit layer 12 rather than to the intermetallic compound layer 17, and thus a region of the circuit layer 12 in the vicinity of the intermetallic compound layer 17 has a structure in which Sn diffuses through Cu.

In the embodiment, since the thickness of the Ti material 25 is in a range of 0.1 μm to 5 μm, and is relatively small, the Ti material 25 is melted into the liquid phase of the Cu—P—Sn—Ni brazing filler material 24. For this reason, none of Ti material 25 remains at the bonded interface between the ceramic substrate 11 and the circuit layer 12.

As a result, the circuit layer 12 is formed on the first surface of the ceramic substrate 11 such that the power module substrate 10 in the embodiment is produced.

Subsequently, the semiconductor element 3 is bonded to the upper surface of the circuit layer 12 of the power module substrate 10 through the solder material (semiconductor element-bonding step S03).

As such, the power module 1 in the embodiment is produced.

In the power module substrate 10 with such a configuration according to the embodiment, at the bonded interface between the ceramic substrate 11 and the circuit layer 12, P and Ni contained in the Cu—P—Sn—Ni brazing filler material 24 are drawn into the intermetallic compound layer 17 formed close to the circuit layer 12, and thus the Cu—Sn layer 14 without an intermetallic compound containing P and Ni is formed close to the ceramic substrate 11. That is, since a rigid intermetallic compound is not formed in the vicinity of the ceramic substrate 11, it is possible to reduce thermal stress generating in the ceramic substrate 11 when the power module substrate 10 undergoes a thermal cycle, and it is possible to limit the occurrence of cracking in the ceramic substrate 11.

Since a rigid intermetallic compound is not formed in the vicinity of the ceramic substrate 11 at the bonded interface between the ceramic substrate 11 and the circuit layer 12 as described above, when the ceramic substrate 11 and the circuit layer 12 are bonded to each other, the bonding rate between the ceramic substrate 11 and the circuit layer 12 is improved, and the ceramic substrate and the metal layer are sufficiently bonded to each other.

Since the intermetallic compound layer 17 is formed in a range of 0.1 μm to 100 μm from the bonded interface between the ceramic substrate 11 and the Cu—Sn layer 14, a rigid intermetallic compound is not formed in the vicinity of the ceramic substrate 11, and it is possible to reliably limit the occurrence of cracking in the ceramic substrate 11, even though the power module substrate 10 undergoes a thermal cycle.

Since the liquid phase of the Cu—P—Sn—Ni brazing filler material 24 comes into direct contact with the Cu foil 22 when the ceramic substrate 11 and the circuit layer 12 are bonded to each other, the intermetallic compound layer 17 and the Cu—Sn layer 14 into which the liquid phase of the Cu—P—Sn—Ni brazing filler material 24 is solidified and formed, are strongly bonded to the circuit layer 12. Since Sn diffuses to the circuit layer 12 rather than to the intermetallic compound layer 17, and a region of the circuit layer 12 in the vicinity of the intermetallic compound layer 17 has a structure in which Sn diffuses through Cu, bonding strength between the ceramic substrate 11 and the circuit layer 12 is improved.

Since the thickness of the Ti material 25 is 0.1 μm or greater, preferably 0.5 μm or greater, and more preferably 1.0 μm or greater, it is possible to form the intermetallic compound layer 17 by reliably combining P and Ni contained in the Cu—P—Sn—Ni brazing filler material 24 with Ti, and to form the Cu—Sn layer 14 without an intermetallic compound containing P and Ni or with a very small amount of an intermetallic compound containing P and Ni. Since the thickness of the Ti material 25 is 5 μm or less, when the ceramic substrate 11 and the circuit layer 12 are bonded to each other, the Ti material 25 is melted into the liquid phase of the Cu—P—Sn—Ni brazing filler material 24, and a Ti layer with relatively high strength is not formed at the bonded interface therebetween. For this reason, when the power module substrate 10 undergoes a thermal cycle, it is possible to limit the occurrence of cracking in the ceramic substrate 11. Since the Ti layer having thermal resistance higher than that of the circuit layer 12 made of the Cu foil 22 is not formed, it is possible to reduce the thermal resistance of the power module substrate 10.

For this reason, the thickness of the Ti material 25 is set to be in a range of 0.1 μm to 5 μm.

In the power module substrate 10 and the power module 1 according to the embodiment, the circuit layer 12 made of the Cu foil 22 is formed on the first surface of the ceramic substrate 11, and thus it is possible to spread out heat from the semiconductor element 3, and to dissipate heat to the ceramic substrate 11. Since the Cu foil 22 has a relatively high resistance to deformation, when the power module substrate 10 undergoes a thermal cycle, it is possible to limit deformation of the circuit layer 12, and deformation of the bonding layer 2 bonding the semiconductor element 3 to the circuit layer 12, and it is possible to improve the reliability of bonding.

According to the method of producing the power module substrate 10 in the embodiment, since the ceramic substrate 11 and the Cu foil 22 is subjected to a heating process with the Cu—P—Sn—Ni brazing filler material 24 and the Ti material 25 being interposed therebetween, during heating, Ti is melted into the liquid phase of the melted Cu—P—Sn—Ni brazing filler material 24, and wettability between the ceramic substrate 11 and the liquid phase of the Cu—P—Sn—Ni brazing filler material 24 is improved.

When the heating temperature is 600° C. or higher in the heating step S02, the Cu—P—Sn—Ni brazing filler material 24 can be reliably melted, and the Ti material 25 can be melted into the melted Cu—P—Sn—Ni brazing filler material 24 at the bonded interface between the ceramic substrate 11 and the Cu foil 22. Therefore, the ceramic substrate 11 and the Cu foil 22 can be reliably bonded to each other. When the heating temperature is 650° C. or less, it is possible to limit the thermal degradation of the ceramic substrate 11, and to reduce thermal stress generating in the ceramic substrate 11. For this reason, in the embodiment, the heating temperature is set to be in a range of 600° C. to 650° C.

When pressure applied to the ceramic substrate 11 and the like is 1 kgf/cm² (0.10 MPa) or greater in the heating step S02, since the ceramic substrate 11 is capable of coming into close contact with the liquid phase of the Cu—P—Sn—Ni brazing filler material 24, the ceramic substrate 11 and the Cu—Sn layer 14 can be sufficiently bonded to each other. When the applied pressure is 35 kgf/cm² (3.43 MPa) or less, it is possible to limit the occurrence of cracking in the ceramic substrate 11. For this reason, in the embodiment, the applied pressure is set to be in a range of 1 kgf/cm² to 35 kgf/cm² (0.10 MPa to 3.43 MPa).

When the heating time is 30 minutes or more in the heating step S02, since it is possible to ensure a sufficient amount of time required when P contained in the melted Cu—P—Sn—Ni brazing filler material 24 is combined with Ti contained in the Ti material 25 at the bonded interface between the ceramic substrate 11 and the Cu foil 22, the Cu—Sn layer can be reliably formed close to the ceramic substrate 11. Even when the heating time exceeds 360 minutes, bondability between the ceramic substrate 11 and the circuit layer 12 is not improved compared to the case in which the heating time is 360 minutes. When the heating time exceeds 360 minutes, productivity is decreased. For this reason, in the embodiment, the heating time is set to be in a range of 30 minutes to 360 minutes.

In the embodiment, since the Cu—P—Sn—Ni brazing filler material 24 with a melting point of 580° C. is used, it is possible to form a liquid phase of the brazing filler material at a low temperature. In the embodiment, the solidus temperature of the Cu—P—Sn—Ni brazing filler material is used as a melting point.

Second Embodiment

Hereinafter, a second embodiment of the present invention will be described. The same reference signs will be assigned to the same configuration elements as in the first embodiment, and detailed descriptions thereof will be omitted.

Figure 6:
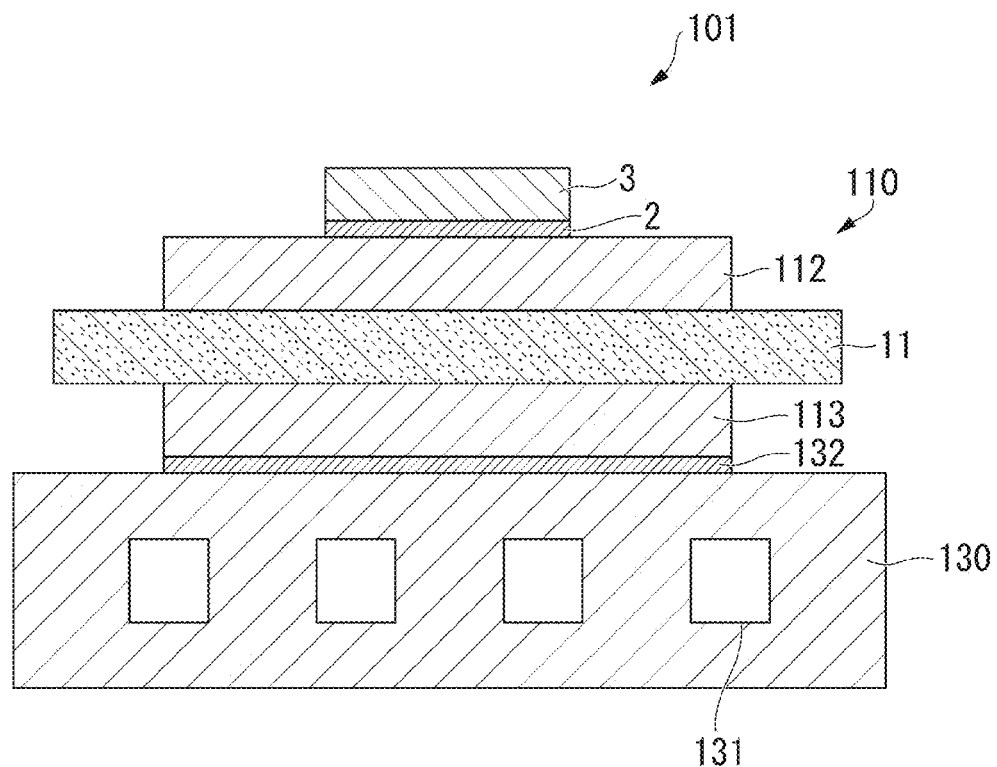
FIG. 6 is a schematic view of a power module in which a power module substrate is used in a second embodiment of the present invention.

FIG. 6 shows power module 101 including a power module substrate 110 in the second embodiment.

The power module 101 includes: the power module substrate 110 in which a circuit layer 112 is provided on the first surface of the ceramic substrate 11; the semiconductor element 3 that is bonded to a surface at one side (an upper surface in FIG. 6) of the circuit layer 112 through the bonding layer 2; and a heat sink 130 disposed on the other side (a lower side in FIG. 6) of the power module substrate 110.

Figure 7:
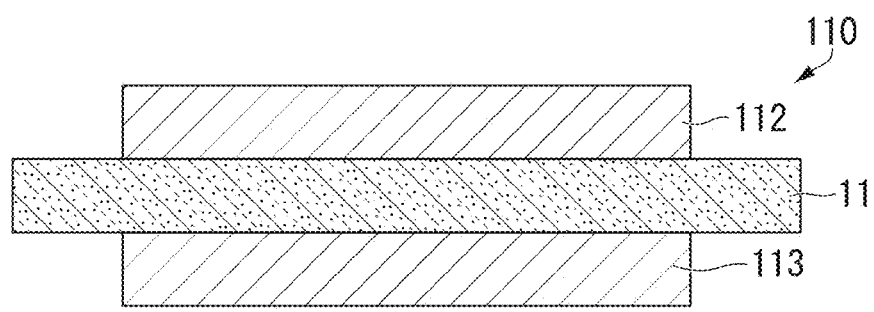
FIG. 7 is a schematic view of the power module substrate in the second embodiment of the present invention.

As shown in FIG. 7, the power module substrate 110 includes: the ceramic substrate 11; the circuit layer 112 provided on the first surface (an upper surface in FIG. 7) which is one surface of the ceramic substrate 11; and a metal layer 113 provided on the second surface (a lower surface in FIG. 7) which is the other surface of the ceramic substrate 11.

The ceramic substrate 11 is made of aluminum nitride (AlN) having good heat radiation.

Figure 10:
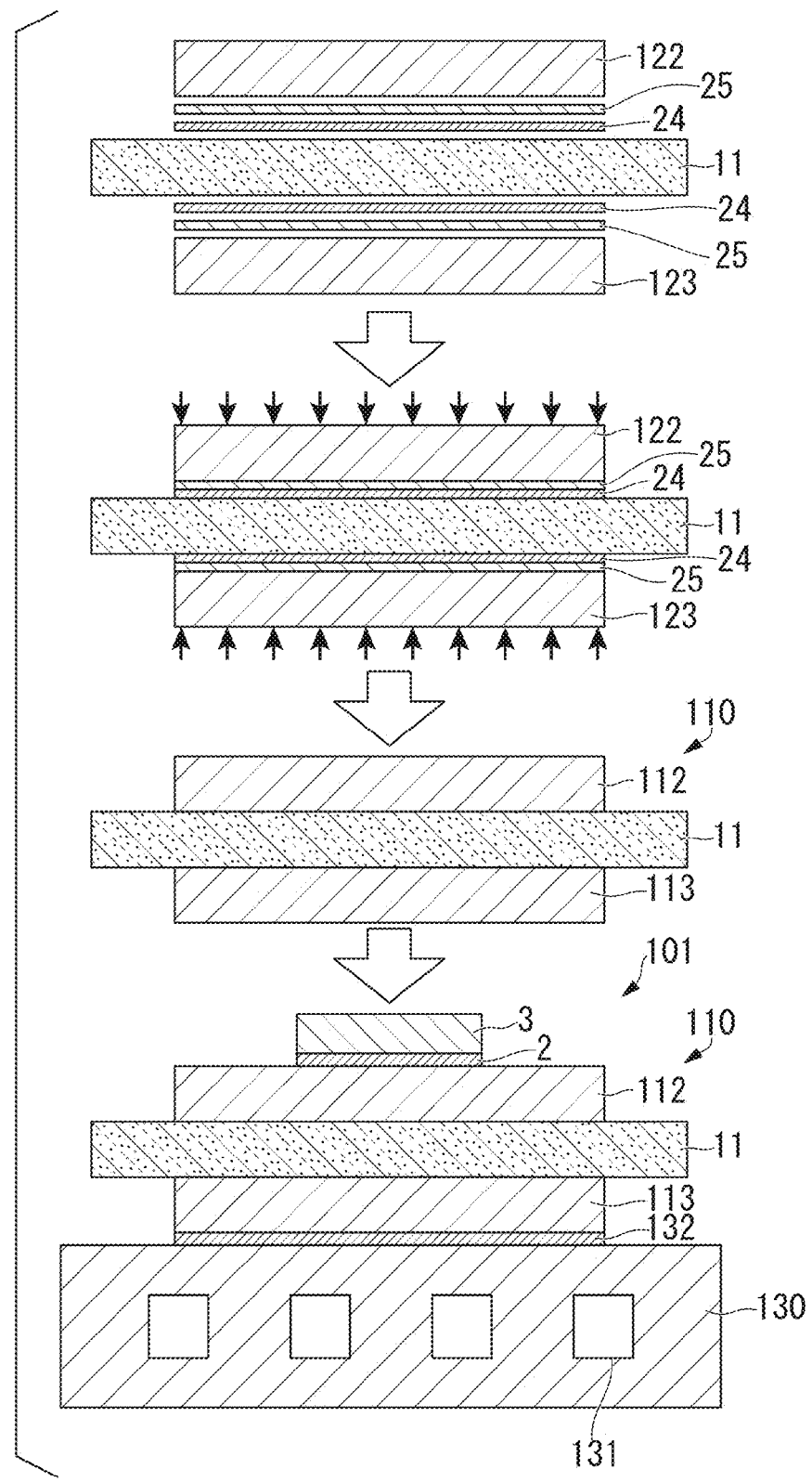
FIG. 10 shows schematic views showing the method of producing the power module substrate and the power module in the second embodiment of the present invention.

Similar to the first embodiment, the circuit layer 112 is formed by bonding a Cu foil 122 to the ceramic substrate 11 through the heating of the Cu—P—Sn—Ni brazing filler material 24, the Ti material 25, and the Cu foil 122 made of oxygen-free copper, which are sequentially laminated on the first surface of the ceramic substrate 11 (refer to FIG. 10).

The thickness of the circuit layer 112 is set to be in a range of 0.1 mm to 1.0 mm. In the second embodiment, the thickness is set to 0.6 mm.

Similar to the first embodiment, the Cu—Sn layer (a first Cu—Sn layer) 14 and the intermetallic compound layer (a first intermetallic compound layer) 17 are formed at the bonded interface between the ceramic substrate 11 and the circuit layer 112. The Cu—Sn layer 14 is positioned close to the ceramic substrate 1. The intermetallic compound layer 17 is positioned between the circuit layer 112 and the Cu—Sn layer 14, and contains P, Ni, and Ti.

The metal layer 113 is formed by bonding a metal plate made of Cu or a Cu alloy to the second surface which is the other surface of the ceramic substrate 11 through a Cu—P—Sn-based brazing filler material. In the second embodiment, the metal layer 113 is formed by bonding the Cu foil 123 to the ceramic substrate 11 through the heating of the Cu—P—Sn—Ni brazing filler material 24, Ti foil as the Ti material 25, and the Cu foil 123 made of oxygen-free copper, which are sequentially laminated on the second surface of the ceramic substrate 11 (refer to FIG. 10).

The thickness of the metal layer 113 is set to be in a range of 0.1 mm to 1.0 mm. In the embodiment, the thickness is set to 0.6 mm.

A Cu—Sn layer (a second Cu—Sn layer) 114 and an intermetallic compound layer (a second intermetallic compound layer) 117 are formed at the bonded interface between the ceramic substrate 11 and the metal layer 113. The Cu—Sn layer 114 is positioned close to the ceramic substrate 11. The intermetallic compound layer 117 is positioned between the metal layer 113 and the Cu—Sn layer 114, and contains P, Ni, and Ti. P and Ni contained in the Cu—P—Sn—Ni brazing filler material 24 are combined with Ti contained in the Ti material 25, and thereby the intermetallic compound layer 117 is formed. The intermetallic compound layer 117 includes at least one or more of a P—Ni—Ti phase 117a, a P—Ti phase 117b, and a Cu—Ni—Ti phase 117c.

Figure 8:
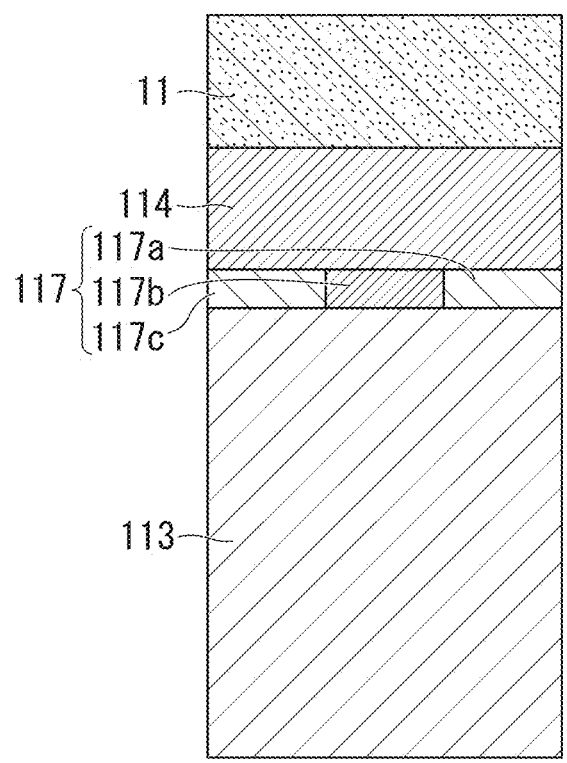
FIG. 8 is a schematic view of the section of the bonded interface between a metal layer and a ceramic substrate shown in FIG. 7.

In the embodiment, as shown in FIG. 8, the intermetallic compound layer 117 includes the P—Ni—Ti phase 17a, the P—Ti phase 17b, and the Cu—Ni—Ti phase 17c.

That is, the Cu—Sn layer (the second Cu—Sn layer) 114 has substantially the same structure as that of the Cu—Sn layer (the first Cu—Sn layer) 14, and the intermetallic compound layer (the second intermetallic compound layer) 117 has substantially the same structure as that of the intermetallic compound layer (the first intermetallic compound layer) 17. The bonded interface between the ceramic substrate 11 and the metal layer 113 has the same structure as that of the bonded interface between the ceramic substrate 11 and the circuit layer 112.

The heat sink 130 dissipates heat from the power module substrate 110. The heat sink 130 is made of Cu or a Cu alloy. In the embodiment, the heat sink 130 is made of oxygen-free copper. The heat sink 130 is provided with flow passages 131 through which a coolant flows. In the embodiment, the heat sink 130 and the metal layer 113 are bonded to each other through a solder layer 132 made of a solder material.

Figure 9:
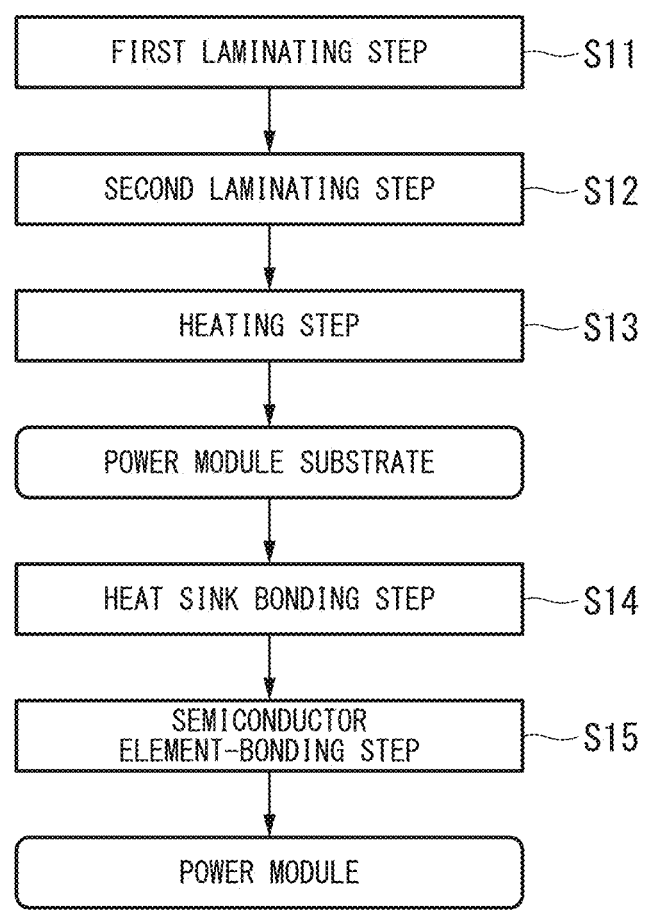
FIG. 9 is a flowchart showing a method of producing the power module substrate and the power module in the second embodiment of the present invention.

Hereinafter, a method of producing the power module 101 in the embodiment be described with reference to the flowchart in FIG. 9, and FIG. 10.

First, as shown FIG. 10, the Cu—P—Sn—Ni brazing filler material 24, the Ti material 25, and the Cu foil 122 which forms into the circuit layer 112 are sequentially laminated on the first surface (an upper surface in FIG. 10) of the ceramic substrate 11 (a first laminating step S11). The Cu—P—Sn—Ni brazing filler material 24, the Ti material 25, and the Cu foil 123 which forms into the metal layer 113 are sequentially laminated on the second surface (a lower surface in FIG. 10) of the ceramic substrate 11 (a second laminating step S12). That is, the Cu—P—Sn—Ni brazing filler material 24 is disposed close to the ceramic substrate 11, and the Ti material 25 is disposed close to each of the Cu foils 122, 123 between the ceramic substrate 11 and each of the Cu foils 122, 123.

The thickness of the Ti material 25 is set to be in a range of 0.1 μm to 5 μm. When the thickness of the Ti material 25 is in a range of 0.1 μm to less than 0.5 μm, the Ti material 25 is preferably film-formed by vapor deposition or spattering. When the thickness is in a range of 0.5 μm to 5 μm, a foil material is preferably used as the Ti material 25. The thickness of the Ti material 25 preferably is in a range of 0.5 μm to 5 μm, and more preferably is in a range of 1.0 μm to 4.0 μm. In the embodiment, the Ti material 25 with a thickness of 1.0 μm is used.

Subsequently, the ceramic substrate 11, the Cu—P—Sn—Ni brazing filler material 24, the Ti material 25, and the Cu foils 122 and 123 are placed into and heated in a vacuum heating furnace while being pressurized (at a pressure of 1 kgf/cm$^2$ to 35 kgf/cm$^2$ (0.10 MPa to 3.43 MPa)) in a laminating direction (heating step S13). In the second embodiment, the internal pressure of the vacuum heating furnace is set to be in a range of $10^{-6}$ Pa to $10^{-3}$ Pa, the heating temperature is set to be in a range of 600° C. to 650° C., and the heating time is set to be in a range of 30 minutes to 360 minutes.

In the heating step S13, the Cu—P—Sn—Ni brazing filler material 24 is melted to form a liquid phase, the Ti material 25 is melted into the liquid phase, and the liquid phase is solidified. Thereby, the ceramic substrate 11 is bonded to each of the Cu foils 122 and 123.

Accordingly, the circuit layer 112 and the metal layer 113 are respectively formed on the first surface and the second surface of the ceramic substrate 11, and thereby the power module substrate 110 in the embodiment is produced.

Subsequently, the heat sink 130 is bonded to a lower surface of the metal layer 113 of the power module substrate 110 through a solder material (heat sink bonding step S14).

Subsequently, the semiconductor element 3 is bonded to the upper surface of the circuit layer 112 of the power module substrate 110 through a solder material (semiconductor element-bonding step S15).

As such, the power module 101 in the embodiment is produced.

The power module substrate 110 with such a configuration according to the second embodiment provides the same effects as the power module substrate 10 in the first embodiment.

The metal layer 113 made of the Cu 123 is formed on the second surface of the ceramic substrate 11, and thus the power module substrate 110 is capable of efficiently dissipating heat from the semiconductor element 3 through the metal layer 113.

Similar to the bonded interface between the ceramic substrate 11 and the circuit layer 112, at the bonded interface between the ceramic substrate 11 and the metal layer 113, the Cu—Sn layer 114, in which Sn forms a solid solution with Cu, is formed closed to the ceramic substrate 11, and a rigid intermetallic compound is not formed in the vicinity of the ceramic substrate 11. For this reason, it is possible to reduce thermal stress generating in the ceramic substrate 11 when the power module substrate 110 undergoes a thermal cycle, and it is possible to limit the occurrence of cracking in the ceramic substrate 11.

Since a rigid intermetallic compound is not formed in the vicinity of the ceramic substrate 11 at the bonded interface between the ceramic substrate 11 and the metal layer 113, the bonding rate between the ceramic substrate and the metal layer is improved such that the ceramic substrate and the metal layer are sufficiently bonded to each other.

Since the heat sink 130 is bonded to the metal layer 113, the power module substrate 110 in the second embodiment is capable of efficiently dissipating heat through the heat sink 130.

According to the method of producing the power module substrate 110 in the second embodiment, the circuit layer 112 and the metal layer 113 are respectively bonded to the first surface which is one surface of the ceramic substrate 11 and the second surface which is the other surface of the ceramic substrate 11, simultaneously. As a result, it is possible to simplify a producing process, and to reduce producing costs.

Third Embodiment

Hereinafter, a third embodiment of the present invention will be described. The same reference signs will be assigned to the same configuration elements as in the first embodiment, and detailed descriptions thereof will be omitted.

Figure 11:
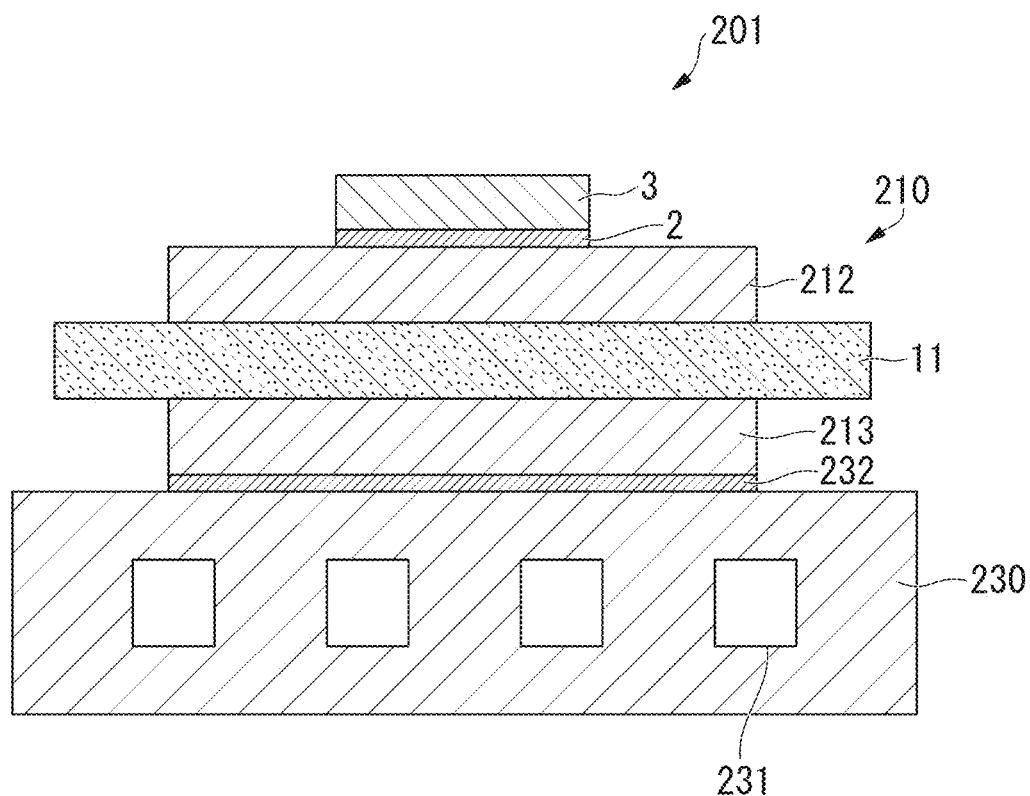
FIG. 11 is a schematic view of a power module in which a power module substrate in a third embodiment of the present invention is used.

FIG. 11 shows a power module 201 including a power module substrate 210 in the third embodiment.

The power module 201 includes: the power module substrate 210 which a circuit layer 212 is provided on the first surface of the ceramic substrate 11; the semiconductor element 3 that is bonded to a surface at one side (an upper surface FIG. 11) of the circuit layer 212 through the bonding layer 2; and a heat sink 230 bonded to the other side (a lower side in FIG. 11) of the power module substrate 210 through a bonding layer 232.

Figure 12:
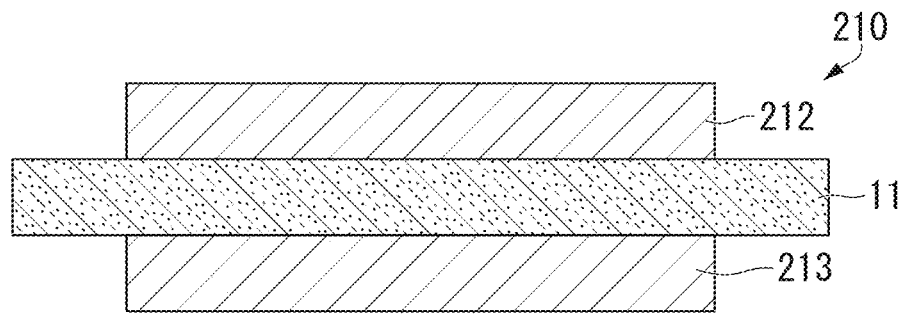
FIG. 12 is a schematic view of the power module substrate in the third embodiment of the present invention.

As shown in FIG. 12, the power module substrate 210 includes: the ceramic substrate 11; the circuit layer 212 provided on the first surface (an upper surface in FIG. 12) which is one surface of the ceramic substrate 11; and a metal layer 213 provided on the second surface (a lower surface in FIG. 12) which is the other surface of the ceramic substrate 11.

The ceramic substrate 11 is made of aluminum nitride (AlN) having good heat radiation.

Figure 14:
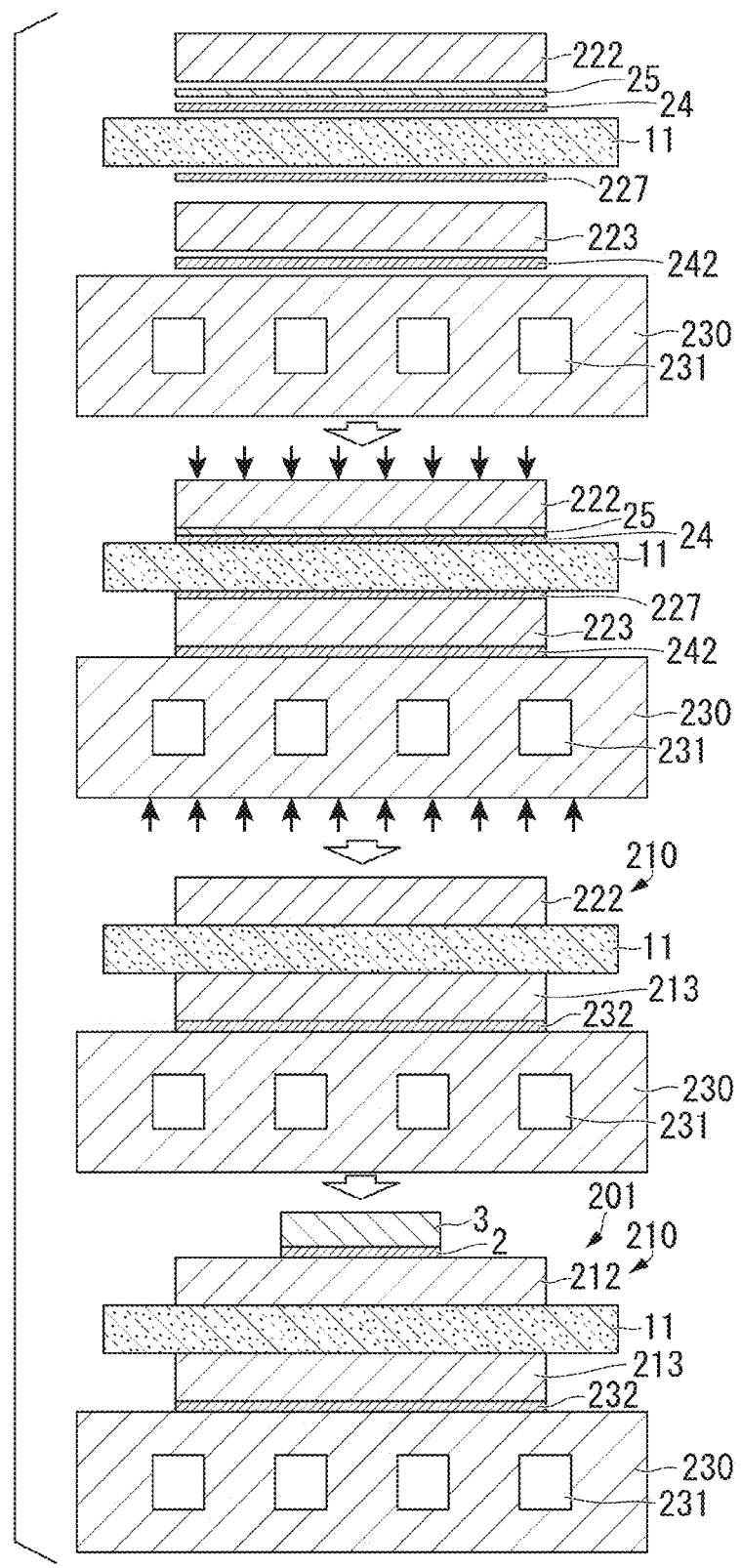
FIG. 14 shows schematic views showing the method of producing the power module substrate and the power module in the third embodiment of the present invention.

Similar to the first embodiment, the circuit a 212 is formed by bonding a Cu foil 222 to the ceramic substrate 11 through the heating of the Cu—P—Sn—Ni brazing filler material 24, Ti foil as the Ti material 25, and the Cu foil 222 made of oxygen-free copper, which are sequentially laminated on the first surface of the ceramic substrate 11 (refer to FIG. 14).

The thickness of the circuit layer 212 is set to be in a range of 0.1 mm to 1.0 mm. In the third embodiment, the thickness is set to 0.6 mm.

Similar to the first embodiment, the Cu—Sn layer 14 and the intermetallic compound layer 17 are formed at the bonded interface between the ceramic substrate 11 and the circuit layer 212. The Cu—Sn layer 14 is positioned close to the ceramic substrate 11. The intermetallic compound layer 17 is positioned between the circuit layer 212 and the Cu—Sn layer 14, and contains P, Ni, and Ti.

The metal layer 213 is formed by bonding a metal plate made of Al or an Al alloy to the second surface which is the other surface of the ceramic substrate 11 through a bonding material 227. In the third embodiment, the metal layer 213 is formed by bonding an Al plate 223 with a purity of 99.99 mass % or more to the second surface of the ceramic substrate 11 (refer to FIG. 14).

The thickness of the metal layer 213 is set to be in a range of 0.1 mm to 3.0 mm. In the embodiment, the thickness is set to 1.6 mm.

The heat sink 230 is made of Al or an Al alloy. In the embodiment, the heat sink 230 is made of A6063 (Al alloy). The heat sink 230 is provided with flow passages 231 through which a coolant flows. The heat sink 230 and the metal layer 213 are bonded to each other through an Al—Si-based brazing filler material.

Figure 13:
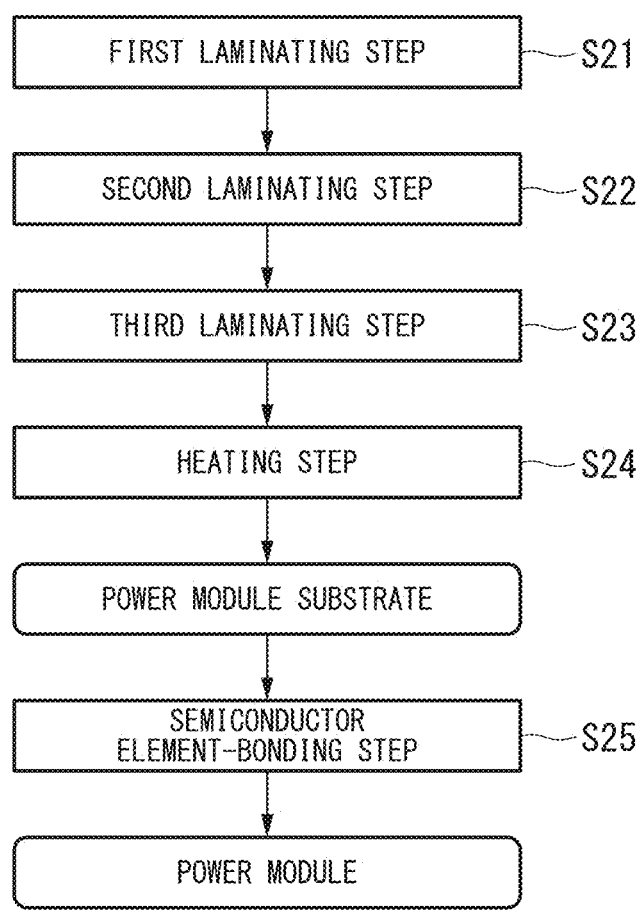
FIG. 13 is a flowchart showing a method of producing the power module substrate and the power module in the third embodiment of the present invention.

Hereinafter, a method of producing the power module 201 in the embodiment will be described with reference to the flowchart in FIG. 13, and FIG. 14.

First, as shown in FIG. 14, the Cu—P—Sn—Ni brazing filler material 24, the Ti material 25, and the Cu foil 222 which forms into the circuit layer 212 are sequentially laminated on the first surface (an upper surface in FIG. 14) of the ceramic substrate 11 (a first laminating step S21). The bonding material 227 and the Al plate 223 which forms into the metal layer 213 are sequentially laminated on the second surface (a lower surface in FIG. 14) of the ceramic substrate 11 with the bonding material 227 interposed between the Al plate 223 and the ceramic substrate 11 (a second laminating step S22). The heat sink 230 is laminated on a lower side of the Al plate 223 with a bonding material 242 interposed between the heat sink 230 and the Al plate 223 (a third laminating step S23).

The thickness of the Ti material 25 is set to be in a range of 0.1 μm to 5 μm. When the thickness of the Ti material 25 is in a range of 0.1 μm to less than 0.5 μm, the Ti material 25 is preferably film-formed by vapor deposition or spattering. When the thickness is in a range of 0.5 μm to 5 μm, a foil material is preferably used as the Ti material 25. The thickness of the Ti material 25 preferably is in a range of 0.5 μm to 5 μm, and more preferably is in a range of 1.0 μm to 4.0 μm.

In the embodiment, the bonding materials 227 and 242 are Al—Si-based brazing filler materials containing Si which low melting point. In the third embodiment, an Al—Si (7.5 mass %) brazing filler material is used.

Subsequently, the ceramic substrate 11, the Cu—P—Sn—Ni brazing filler material 24, the Ti material 25, the Cu foil 222, the bonding material 227, the Al plate 223, the bonding material 242, and the heat sink 230 are placed into and heated in a vacuum heating furnace while being pressurized (at a pressure of 1 kgf/cm² to 35 kgf/cm² (0.10 MPa to 3.43 MPa)) in a laminating direction (heating step S24). In the third embodiment, the internal pressure of the vacuum heating furnace is set to be in a range of $10^{-6}$ Pa to $10^{-3}$ Pa, the heating temperature is set to be in a range of 600° C. to 650° C. and the heating time is set to be in a range of 30 minutes to 360 minutes.

In the heating step S24, the Cu—P—Sn—Ni brazing filler material is melted to form a liquid phase, the Ti material d into the liquid phase, and the liquid phase is solidified. Thereby, the ceramic substrate 11 is bonded to the Cu foil 222. In the heating step S24, the bonding material 227 is melted to form a liquid phase, and the liquid phase is solidified. Thereby, the ceramic substrate 11 and the Al plate 223 are bonded to each other through the bonding material 227. In the heating step S24, the bonding material 242 is melted to form a liquid phase, and the liquid phase is solidified. Thereby, the Al plate 223 and the heat sink 230 are bonded to each other through the bonding material 242.

Accordingly, the power module substrate 210 in the third embodiment is produced.

Subsequently, the semiconductor element 3 is bonded to the upper surface of the circuit layer 212 of the power module substrate 210 through a solder material (semiconductor element-bonding step S25).

As such, the power module 201 in the third embodiment is produced.

The power module substrate 210 with such a configuration according to the third embodiment provides the same effects as the power module substrate 10 in the first embodiment.

The Al plate 223 is bonded to the second surface of the ceramic substrate 11 such that the metal layer 213 is formed, and thus the power module substrate 210 in the third embodiment is capable of efficiently dissipating heat from the semiconductor element 3 through the metal layer 213. Since Al has a relatively low resistance to deformation, when the power module substrate 210 undergoes a thermal cycle, the metal layer 213 is capable of absorbing thermal stress occurring between the power module substrate 210 and the heat sink 230. As a result, it is possible to limit the occurrence of cracking in the ceramic substrate 11.

According to the method of producing the power module substrate 210 in the third embodiment, the circuit layer 212 and the metal layer 213 are respectively bonded to the first surface and the second surface of the ceramic substrate 11 simultaneously. As a result, it is possible to simplify a producing process, and to reduce producing costs.

Fourth Embodiment

Hereinafter, a fourth embodiment of the present invention will be described. The same reference signs will be assigned to the same configuration elements as in the first embodiment, and detailed descriptions thereof will be omitted.

Figure 15:
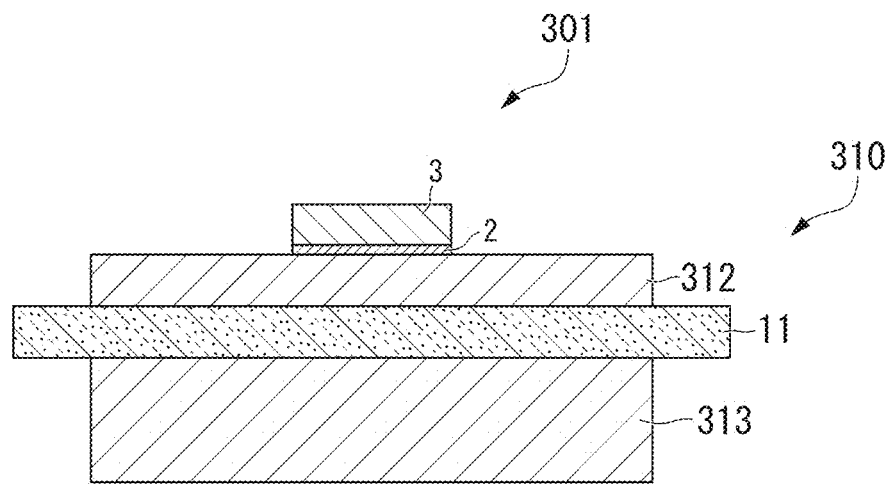
FIG. 15 is a schematic view of a power module in which a power module substrate in a fourth embodiment of the present invention is used.

FIG. 15 shows a power module 301 including a power module substrate 310 in the fourth embodiment.

The power module 301 includes the power module substrate 310 in which a circuit layer 312 is provided on the first surface of the ceramic substrate 11, and the semiconductor element 3 bonded to one surface (an upper surface in FIG. 15) of the circuit layer 312 through the bonding layer 2.

As shown in FIG. 15, the power module substrate 310 includes: the ceramic substrate 11; the circuit layer 312 provided on the first surface (an upper surface in FIG. 15) which is one surface of the ceramic substrate 11; and a metal layer 313 provided on the second surface (a lower surface in FIG. 15) which is the other surface of the ceramic substrate 11.

The ceramic substrate 11 is made of aluminum nitride (AlN) having good heat radiation.

Figure 18:
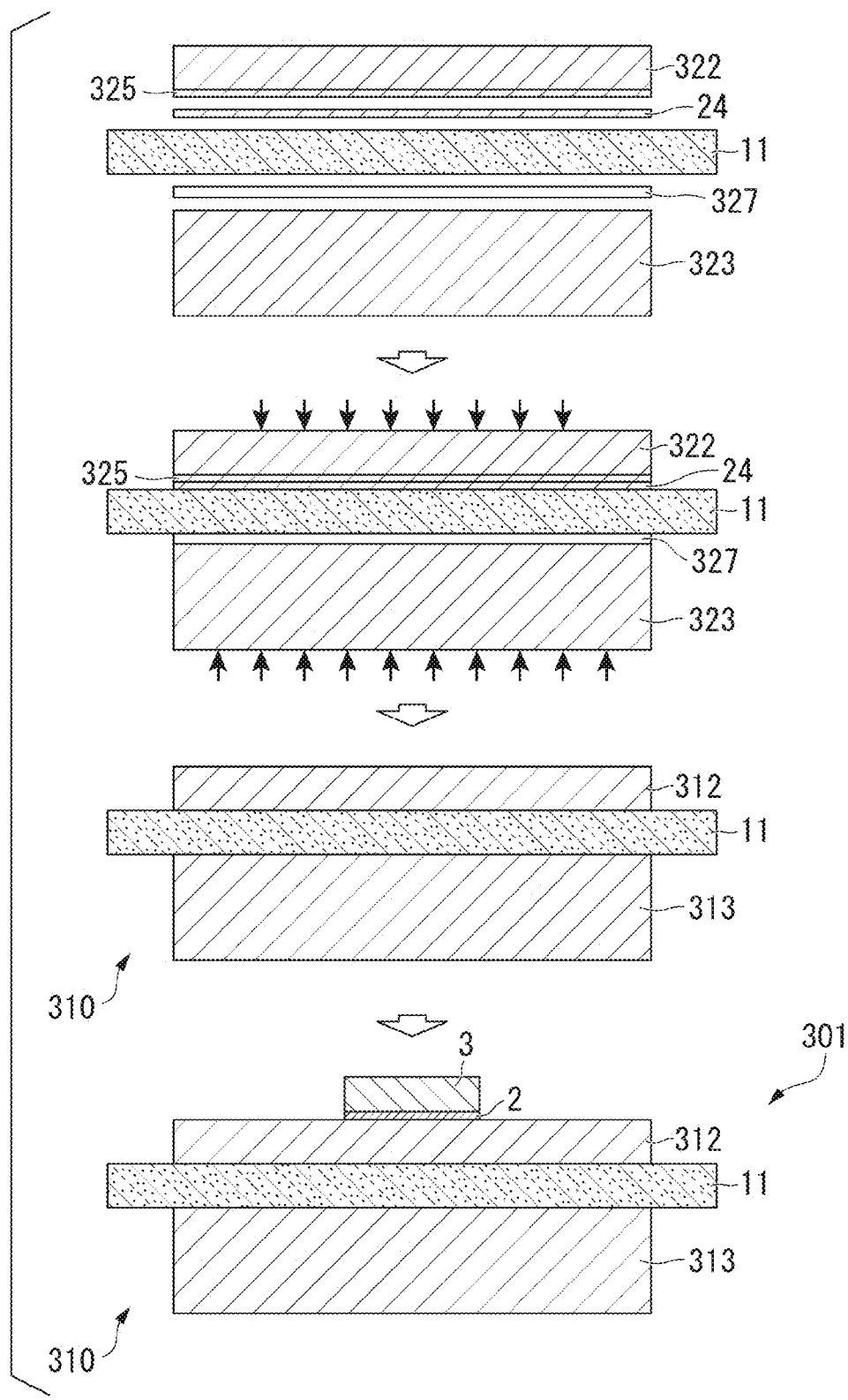
FIG. 18 shows schematic views showing the method of producing the power module substrate and the power module in the fourth embodiment of the present invention.

Similar to the first embodiment, the circuit layer 312 is formed by bonding a Cu foil 322 to the ceramic substrate 11 through the heating of the Cu—P—Sn—Ni brazing filler material 24, the Ti material 325, and the Cu foil 322 made of oxygen-free copper, which are sequentially laminated on the first surface of the ceramic substrate 11 (refer to FIG. 18).

The thickness of the circuit layer 312 is set to be in a range of 0.1 mm to 1.0 mm. In the embodiment, the thickness is set to 0.6 mm.

In the embodiment, circuit patterns are formed on the circuit layer 312 by etching.

Figure 16:
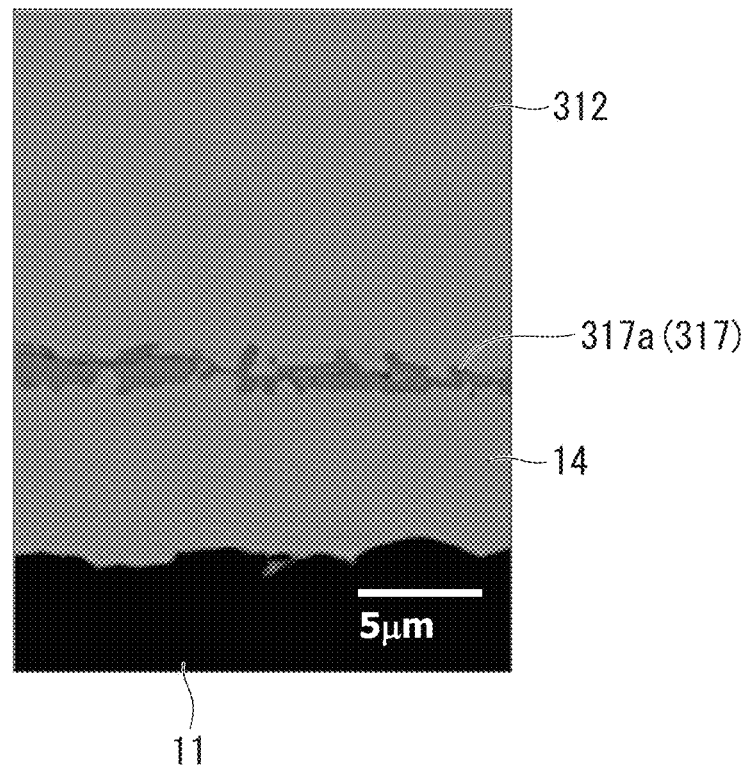
FIG. 16 is an electron micrograph obtained by capturing an image of the section of the bonded interface between a circuit layer and a ceramic layer of the power module substrate in the fourth embodiment of the present invention.

As shown in FIG. 16, the Cu—Sn layer 14 and an intermetallic compound layer 317 are formed at the bonded interface between the ceramic substrate 11 and the circuit layer 312. The Cu—Sn layer 14 is positioned close to the ceramic substrate 11, and the intermetallic compound layer 317 is positioned between the circuit layer 312 and the Cu—Sn layer 14, and contains P, Ni, and Ti.

In the embodiment, as shown in FIG. 16, P—Ni—Ti phases 317a are formed as the intermetallic compound layer 317. The P—Ni—Ti phases 317a are distributed in the form of islands.

The metal layer 313 is formed by bonding a metal plate made of Al or an Al alloy to the second surface which is the other surface of the ceramic substrate 11. In the fourth embodiment, the metal layer 313 is formed by bonding an Al plate 323 with a purity of 99.99 mass % or more to the second surface of the ceramic substrate 11 (refer to FIG. 18).

The thickness of the metal layer 313 is set to be in a range of 0.1 mm to 3.0 mm. In the embodiment, the thickness is set to 1.6 mm.

Figure 17:
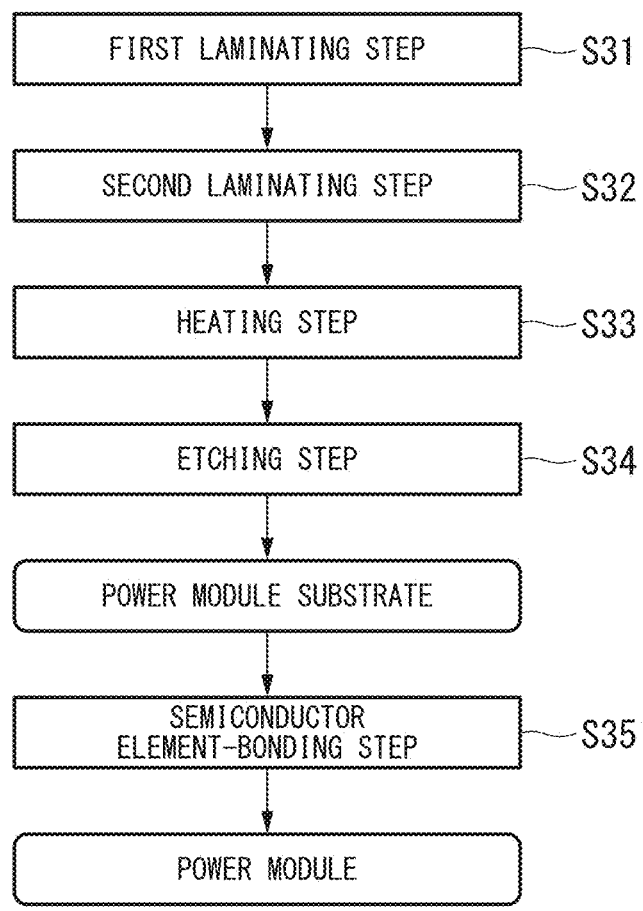
FIG. 17 is a flowchart showing a method of producing the power module substrate and the power module in the fourth embodiment of the present invention.

Hereinafter, a method of producing the power module 301 in the embodiment will be described with reference to the flowchart in FIG. 17, and FIG. 18.

First, as shown in FIG. 18, the Cu—P—Sn—Ni brazing filler material 24, a Ti material 325, and the Cu foil 322 which forms into the circuit layer 312 are sequentially laminated on the first surface (an upper surface in FIG. 18) of the ceramic substrate 11 (a first laminating step S31). A bonding material 327 and the Al plate 323 which forms into the metal layer 313) are sequentially laminated on the second surface (a lower surface in FIG. 18) of the ceramic substrate 11 with the bonding material 327 interposed between the Al plate 323 and the ceramic substrate 11 (a second laminating step S32).

In the embodiment, the thickness of the Ti material 325 is in a range of 0.1 µm to less than 0.5 µm, and preferably is in a range of 0.1 µm to 0.3 µm. The Ti material 325 with such a thin thickness is preferably film-formed on a bonded surface of the Cu foil 322 by vapor deposition or spattering.

Subsequently, the ceramic substrate 11, the Cu—P—Sn—Ni brazing filler material 24, the Ti material 325, the Cu foil 322, the bonding material 327, and the Al plate 323 are placed into and heated in a vacuum heating furnace while being pressurized (at a pressure of 1 kgf/cm² to 35 kgf/cm² (0.10 MPa to 3.43 MPa)) in a laminating direction (heating step S33). In the fourth embodiment, the internal pressure of the vacuum heating furnace is set to be in a range of $10^{-6}$ Pa to $10^{-3}$ Pa, the heating temperature is set to be in a range of 600° C. to 650° C., and the heating time is set to be in a range of 30 minutes to 360 minutes.

In the heating step S33, the Cu—P—Sn—Ni brazing filler material 24 is melted to form a liquid phase, the Ti material 325 is melted into the liquid phase, and the liquid phase is solidified. Thereby, the ceramic substrate 11 and the Cu foil 322 are bonded to each other. The bonding material 327 is incited to form a liquid phase, and the liquid phase is solidified. Thereby, the ceramic substrate 11 and the Al plate 323 are bonded to each other through the bonding material 327.

Subsequently, the circuit layer 312 of the power module substrate 310 undergoes an etching process such that circuit patterns are formed on the circuit layer 312 (etching step S34).

In the etching step S34, the circuit layer 312 is etched in an aqueous solution of ferric chloride (III) for 10 minutes.

Accordingly, the power module substrate 310 in the fourth embodiment is produced.

Subsequently, the semiconductor element 3 is bonded to the upper surface of the circuit layer 312 of the power module substrate 310 through a solder material (semiconductor element-bonding step S35).

As such, the power module 301 in the fourth embodiment is produced.

The power module substrate 310 with such a configuration according to the fourth embodiment provides the same effects as the power module substrate 10 in the first embodiment.

As shown in FIG. 16, in the power module substrate 310 according to the fourth embodiment, the P—Ni—Ti phases 317a, which are distributed in the form of islands, are formed as the intermetallic compound layer 317 containing P, Ni, and Ti, and thus a residue is unlikely to occur in the etching step S34. Accordingly, high-precision circuit patterns can be formed on the circuit layer 312 by etching.

With etching properties being taken into consideration, the thickness of the Ti material 325 is 0.1 µm to less than 0.5 µm, and preferably, is in a range of 0.1 µm to 0.3 µm.

The embodiments of the present invention have been described; however, the present invention is not limited to the embodiments, and modifications can be appropriately made to the embodiments insofar as the modifications do not depart from the technical spirit of the invention.

In the second and third embodiments, the circuit layer and the metal layer are respectively bonded to the first surface and the second surface of the ceramic substrate simultaneously; however, the circuit layer and the metal layer may be independently bonded to the respective surfaces of the ceramic substrate.

In the third embodiment, the bonding of the circuit layer, the metal layer, and the heat sink is performed simultaneously; however, after the circuit layer and the metal layer are bonded to the ceramic substrate, the metal layer and the heat sink may be bonded to each other.

In the third and fourth embodiments, the metal layer is bonded to the second surface of the ceramic substrate through an Al—Si-based brazing filler material; however, the metal layer may be bonded to the second surface of the ceramic substrate by a transient liquid phase (TLP) bonding method, an Ag paste, or the like.

In the second and third embodiments, the heat sink with the flow passages are used; however, a plate-like heat sink called a heat radiation plate, or a heat sink with pin-like fins may be used. The power module substrate and the heat sink are bonded to each other through a solder material or a brazing filler material; however, grease may be applied between the power module substrate and the heat sink, and the power module substrate and the heat sink may be fixed together with screws. In the power module substrates according to the second and third embodiments, the heat sink may not be bonded to the other surface of the power module substrate (the second surface of the ceramic substrate).

In the first to third embodiments, Ti foil is used as a Ti material or a Ti material is formed by vapor deposition or spattering; however, it is possible to use a Cu member/Ti clad material in which Ti is provided on one surface of a Cu member.

In addition, it is possible to use a Ti material/brazing clad material in which a Cu—P—Sn-based brazing filler material is provided on one surface of a Ti material, or a Cu member/Ti material/brazing clad material in which a Cu member, a Ti material, and a Cu—P—Sn-based brazing filler material are sequentially laminated.

In the first to third embodiments, Ti foil as Ti material is interposed between the Cu—P—Sn-based brazing filler material and the Cu foil; however, the present invention is not limited to this configuration, and Ti foil can be interposed between the ceramic substrate and the Cu—P—Sn-based brazing filler material.

In the fourth embodiment, the Ti material is formed on the bonding surface of the Cu foil; however, the present invention is not limited to this configuration, and the Ti material may be formed on the bonding surface of the ceramic substrate.

In the embodiments, a foil material is used as the Cu—P—Sn-based brazing filler material; however, the present invention is not limited to this material, and Cu—P—Sn-based brazing filler powder may be used, or a paste of Cu—P—Sn-based brazing filler powder may be used.

EXAMPLES

Example 1

Hereinafter, results of confirmation tests (Example 1) performed to confirm the effects of the embodiments of the present invention will be described.

Sheets of Cu—P—Sn-based brazing fill foil (37 mm×37 mm) with thicknesses shown in Table 1; Ti materials (37 mm×37 mm) with thicknesses shown in Table 1; and Cu foils (37 mm×37 mm×0.3 mm thickness) made of oxygen-free copper were sequentially laminated on first surfaces of ceramic substrates (40 mm×40 mm) shown in Table 1. When the material of the ceramic substrate was AlN, the thickness of the ceramic substrate was set to 0.635 mm, and when the material was $Si_3N_4$, the thickness was set to 0.32 mm.

While being pressurized at a pressure of 15 kgf/cm² (1.47 MPa) in a laminating direction, the ceramic substrate, the Cu—P—Sn-based brazing filler foil, the Ti material, and the Cu foil, which were laminated on each other, were placed into and heated in a vacuum heating furnace. Thereby, the Cu foil was bonded to the first surface of the ceramic substrate, and a circuit layer was formed. The internal pressure of the vacuum heating furnace was set to be in a range of $10^{-6}$ Pa to $10^{-3}$ Pa, and the heating temperature and the heating time were set to the conditions shown in Table 1. As such, the power module substrates in Examples 1-1 to 1-13 of the present invention were obtained. In Examples 1-1 to 1-10, 1-12, and 1-13 of the present invention, Ti foil was used as the Ti material. In Example 1-11 of the present invention, a Ti film as the Ti material was formed on a bonding surface of the Cu foil by spattering.

A power module substrate in Comparative Example 1 was obtained in the following manner. Cu—P—Sn-based brazing filler materials (37 mm×37 mm) with thicknesses shown in Table 1 and Cu foils (37 mm×37 mm×0.3 mm thickness) made of oxygen-free copper were sequentially laminated on first surfaces of ceramic substrates (40 mm×40 mm×0.635 mm thickness) made of AlN. While being pressurized at a pressure of 15 kgf/cm² (1.47 MPa) in a laminating direction, the ceramic substrate, the Cu—P—Sn-based brazing filler material, and the Cu foil, which were laminated on each other, were placed into and heated in a vacuum heating furnace. Thereby, the Cu foil was bonded to the first surface of the ceramic substrate, and a circuit layer was formed. That is, in the power module substrate of Comparative Example 1, the ceramic substrate and the Cu foil were bonded to each other without a Ti material being interposed therebetween.

In each of the power module substrates obtained in the aforementioned manner, the initial bonding rate between the circuit layer and the ceramic substrate was evaluated. A method of evaluating the bonding rate will be described below.

In each of the obtained power module substrates, it was confirmed whether an intermetallic compound layer containing P and Ti is present at the bonded interface between the ceramic substrate and the circuit layer. A method of confirming whether an intermetallic compound layer containing P and Ti is present will be described below.

(Evaluation of Bonding Rate)

In the power module substrate, the bonding rate of the interface between the ceramic substrate and the circuit layer was evaluated by an ultrasonic flaw detector (FineSAT200 manufactured by Hitachi Power Solutions), and was calculated by the following expression.

An initial bonding area was an area before bonding, which has to be bonded. In the examples, the initial bonding area was the area (37 mm×37 mm) of the circuit layer. Exfoliation in an image obtained by binarizing an ultrasonic-detected image was shown by a white portion in a bonding portion, and thus the area of the white portion was deemed to be an exfoliation area.

(Bonding Rate (%)={(Initial Bonding Area)−(Exfoliation Area)}/(Initial Bonding Area)×100

(Method of Confirming Whether Intermetallic Compound Layer Containing P and Ti is Present)

An intermetallic compound layer containing P and Ti was deemed to be a region in which P and Ti elements were co-present at the interface between Ti and the Cu—P—Sn-based brazing filler material (in section in parallel with the laminating direction), and based on the mapping of P and Ti elements using Electron Micro Analyzer (EPMA) (JXA-8530F manufactured by JEOL), and it was confirmed whether the intermetallic compound layer was present.

Results of the aforementioned evaluations were shown in Table 1.

TABLE 1

| | Components of Cu—P—Sn-based Brazing Filler Material | Thickness of Cu—P—Sn-based Brazing Filler Material μm | Melting Point of Cu—P—Sn-based Brazing Filler Material |
|---|---|---|---|
| Example 1-1 | Cu-6.3 mass % of P-9.3 mass % of Sn-7 mass % of Ni | 20 | 600° C. |

TABLE 1-continued

| | | | |
|---|---|---|---|
| Example 1-2 | Cu-7 mass % of P-15 mass % of Sn-10 mass % of Ni | 20 | 580° C. |
| Example 1-3 | Cu-7 mass % of P-15 mass % of Sn-10 mass % of Ni | 20 | 580° C. |
| Example 1-4 | Cu-7mass % of P-15 mass % of Sn-10 mass % of Ni | 20 | 580° C. |
| Example 1-5 | Cu-7 mass % of P-15 mass % of Sn-10 mass % of Ni | 20 | 580° C. |
| Example 1-6 | Cu-7 mass % of P-15 mass % of Sn-10 mass % of Ni | 20 | 580° C. |
| Example 1-7 | Cu-7 mass % of P-15 mass % of Sn-10 mass % of Ni | 20 | 580° C. |
| Example 1-8 | Cu-7 mass % of P-15 mass % of Sn-10 mass % of Ni | 20 | 580° C. |
| Example 1-9 | Cu-7 mass % of P-15 mass % of Sn-10 mass % of Ni | 20 | 580° C. |
| Example 1-10 | Cu-6.3 mass % of P-9.3 mass % of Sn-7 mass % of Ni | 20 | 600° C. |
| Example 1-11 | Cu-7 mass % of P-15 mass % of Sn-10 mass % of Ni | 20 | 580° C. |
| Example 1-12 | Cu-7 mass % of P-15 mass % of Sn-5 mass % of Mn | 20 | 580° C. |
| Example 1-13 | Cu-7 mass % of P-15 mass % of Sn-7 mass % of Cr | 20 | 580° C. |
| Comparative Example 1 | Cu-7 mass % of P-15 mass % of Sn-10 mass % of Ni | 20 | 580° C. |

| | Thickness of Ti Material | Material of Ceramic Substrate | Heating Conditions | | Existence of Intermetallic Compound Layer Containing P and Ti | Initial Bonding Rate |
|---|---|---|---|---|---|---|
| | μm | | Temperature | Time | | % |
| Example 1-1 | 2 | AlN | 650° C. | 120 min. | Yes | 98.3 |
| Example 1-2 | 0.3 | AlN | 650° C. | 150 min. | Yes | 94.5 |
| Example 1-3 | 0.3 | AlN | 650° C. | 150 min. | Yes | 95.2 |
| Example 1-4 | 0.5 | AlN | 650° C. | 150 min. | Yes | 97.2 |
| Example 1-5 | 1 | AlN | 650° C. | 150 min. | Yes | 98.9 |
| Example 1-6 | 3 | AlN | 650° C. | 150 min. | Yes | 99.7 |
| Example 1-7 | 5 | AlN | 650° C. | 150 min. | Yes | 99.6 |
| Example 1-8 | 1 | AlN | 630° C. | 210 min. | Yes | 97.6 |
| Example 1-9 | 1 | AlN | 600° C. | 300 min. | Yes | 97.7 |
| Example 1-10 | 2 | $Si_3N_4$ | 650° C. | 120 min. | Yes | 98.3 |
| Example 1-11 | 0.3 | $Si_3N_4$ | 650° C. | 150 min. | Yes | 94.5 |
| Example 1-12 | 4 | AlN | 650° C. | 150 min. | Yes | 98.9 |
| Example 1-13 | 4 | AlN | 650° C. | 150 min. | Yes | 99.5 |
| Comparative Example 1 | — | AlN | 650° C. | 150 min. | No | 0.0 |

As shown in Table 1, in Examples 1-1 to 1-13 of the present invention, the ceramic substrate and the Cu foil were bonded together with the Cu—P—Sn-based brazing filler material and the Ti material being interposed therebetween, and thus it was confirmed that the initial bonding rate between the ceramic substrate and the circuit layer was high, and the ceramic substrate and the circuit layer were sufficiently bonded to each other.

In contrast, in Comparative Example 1, the ceramic substrate and the Cu foil were bonded to each other without the Ti material being interposed therebetween, and thus the ceramic substrate and the Cu foil (circuit layer) could not be bonded together.

Example 2

Hereinafter, results of confirmation tests (Example 2) performed to confirm the effects of the embodiments of the present invention will be described.

Sheets of Cu—P—Sn-based brazing filler foil (37 mm×37 mm) with thicknesses shown in Table 2; Ti materials (37 mm×37 mm) with thicknesses shown in Table 2; and Cu foils (37 mm×37 mm×0.3 mm thickness) made of oxygen-free copper were sequentially laminated on first surfaces and second surfaces of ceramic substrates (40 mm×40 mm) shown in Table 2. When the material of the ceramic substrate was AlN, the thickness of the ceramic substrate was set to 0.635 mm, and when the material was $Si_3N_4$, the thickness was set to 0.32 mm.

While being pressurized at a pressure of 15 kgf/cm² (1.47 MPa) in a laminating direction, the ceramic substrate, the Cu—P—Sn-based brazing filler foil, the Ti material, and the Cu foil, which were laminated on each other, placed into and heated in a vacuum heating furnace. Thereby, the Cu foils were respectively bonded to the first surface and the second surface of the ceramic substrate, and a circuit layer and a metal layer were formed. The internal pressure of the vacuum heating furnace was set to be in a range of $10^{-6}$ Pa to $10^{-3}$ Pa, and the heating temperature and the heating time were set to the conditions shown in Table 2. As such, the power module substrates in Examples 2-1 to 2-13 of the present invention were obtained. In Examples 2-1 to 2-10, 2-12, and 2-13 of the present invention, Ti foil was used as the Ti material. In Example 2-11 of the present invention, a Ti film as the Ti material was formed on a bonding surface of the Cu foil by spattering.

A power module substrate in Comparative Example 2 was obtained using a method which was the same as that used to obtain the power module substrates in Examples 2-1 to 2-13 except the fact that the ceramic substrate and the circuit layer were bonded to each other without the Ti material being interposed therebetween.

In each of the power module substrates obtained in the aforementioned manner, the initial bonding rate between the circuit layer and the ceramic substrate, and the bonding rate after the thermal cycle test were measured. The number of cycles of thermal cycle tests performed until the occurrence of cracking in the ceramic substrate of the power module substrate was measured.

In each of the obtained power module substrates, it was confirmed whether an intermetallic compound layer containing P and Ti was present at the bonded interface between the ceramic substrate and the circuit layer.

Similar to Example 1, the bonding rate was evaluated, and it was confirmed whether an intermetallic compound layer containing P and Ti was present. The thermal cycle test was performed as described below.

(Thermal Cycle Test)

One cycle of the thermal cycle test was complete by placing the power module substrate in a liquid phase (Fluorinert) at −40° C. for 3 minutes and 150° C. for 7 minutes using a thermal shock tester TSB-51 manufactured by ESPEC. The thermal cycle tests were performed in 2000 cycles. The power module substrate, in which cracking did not occur in the ceramic substrate even after the thermal cycle tests were performed in 2000 cycles, was denoted by ">2000" in Table 2.

Results of the aforementioned evaluations were shown in Table 2.

TABLE 2

| | Components of Cu—P—Sn-based Brazing Filler Material | Thickness of Cu—P—Sn-based Brazing Filler Material μm | Melting Point of Cu—P—Sn-based Brazing Filler Material | Thickness of Ti Material μm |
|---|---|---|---|---|
| Example 2-1 | Cu-6.3 mass % of P-9.3 mass % of Sn-7 mass % of Ni | 20 | 600° C. | 1 |
| Example 2-2 | Cu-7 mass % of P-15 mass % of Sn-10 mass % of Ni | 20 | 580° C. | 0.3 |
| Example 2-3 | Cu-7 mass % of P-15 mass % of Sn-10 mass % of Ni | 20 | 580° C. | 0.3 |
| Example 2-4 | Cu-7 mass % of P-15 mass % of Sn-10 mass % of Ni | 20 | 580° C. | 0.5 |
| Example 2-5 | Cu-7 mass % of P-15 mass % of Sn-10 mass % of Ni | 20 | 580° C. | 1 |
| Example 2-6 | Cu-7 mass % of P-15 mass % of Sn-10 mass % of Ni | 20 | 580° C. | 3 |
| Example 2-7 | Cu-7 mass % of P-15 mass % of Sn-10 mass % of Ni | 20 | 580° C. | 5 |
| Example 2-8 | Cu-7 mass % of P-15 mass % of Sn-10 mass % of Ni | 20 | 580° C. | 1 |
| Example 2-9 | Cu-7 mass % of P-15 mass % of Sn-10 mass % of Ni | 20 | 580° C. | 1 |
| Example 2-10 | Cu-6.3 mass % of P-9.3 mass % of Sn-7 mass % of Ni | 20 | 600° C. | 1 |
| Example 2-11 | Cu-7 mass % of P-15 mass % of Sn-10 mass % of Ni | 20 | 580° C. | 0.3 |
| Example 2-12 | Cu-7 mass % of P-15 mass % of Sn-5 mass % of Mn | 20 | 580° C. | 2 |
| Example 2-13 | Cu-7 mass % of P-15 mass % of Sn-7 mass % of Cr | 20 | 580° C. | 2 |
| Comparative Example 2 | Cu-7 mass % of P-15 mass % of Sn-10 mass % of Ni | 20 | 580° C. | — |

| | Material of Ceramic Substrate | Heating Conditions Temperature | Heating Conditions Time | Existence of Intermetallic Compound Layer Containing P and Ti | Initial Bonding Rate % | Bonding Rate After Thermal Cycle % | Cracking in Ceramic Substrate Number of Thermal Cycles |
|---|---|---|---|---|---|---|---|
| Example 2-1 | AlN | 650° C. | 120 min. | Yes | 99.8 | 99.2 | >2000 |
| Example 2-2 | AlN | 650° C. | 90 min. | Yes | 97.1 | 90.1 | >2000 |
| Example 2-3 | AlN | 650° C. | 90 min. | Yes | 96.8 | 91.2 | >2000 |
| Example 2-4 | AlN | 650° C. | 90 min. | Yes | 99.2 | 97.2 | >2000 |
| Example 2-5 | AlN | 650° C. | 90 min. | Yes | 99.7 | 98.5 | >2000 |
| Example 2-6 | AlN | 650° C. | 90 min. | Yes | 99.6 | 98.9 | >2000 |
| Example 2-7 | AlN | 650° C. | 90 min. | Yes | 98.9 | 97.4 | 1500-2000 |
| Example 2-8 | AlN | 630° C. | 150 min. | Yes | 97.2 | 95.3 | >2000 |
| Example 2-9 | AlN | 600° C. | 360 min. | Yes | 98.3 | 93.2 | >2000 |
| Example 2-10 | $Si_3N_4$ | 650° C. | 120 min. | Yes | 98.6 | 94.7 | >2000 |
| Example 2-11 | $Si_3N_4$ | 650° C. | 90 min. | Yes | 96.9 | 93.8 | >2000 |
| Example 2-12 | AlN | 650° C. | 90 min. | Yes | 98.4 | 98.0 | >2000 |
| Example 2-13 | AlN | 650° C. | 90 min. | Yes | 99.6 | 98.7 | >2000 |

TABLE 2-continued

| Comparative Example 2 | AlN | 650° C. | 90 min. | No | 0.0 | — | — |

As shown in Table 2, in Examples 2-1 to 2-13 of the present invention, the ceramic substrate and the Cu foil were bonded to each other with the Cu—P—Sn-based brazing filler material and the Ti material being interposed therebetween, and thus it was confirmed that the initial bonding rate between the ceramic substrate and the circuit layer was high, and the ceramic substrate and the circuit layer were sufficiently bonded together. In Examples 2-1 to 2-13 of the present invention, it was confirmed that the bonding rate after the thermal cycle test was high, and the reliability of bonding was high. In Examples 2-1 to 2-13 of the present invention, it was confirmed that the number of cycles of thermal cycle tests, which were performed until the occurrence of cracking in the ceramic substrate, was large, and cracking was unlikely to occur in the ceramic substrate.

In contrast, in Comparative Example 2, the ceramic substrate and the Cu foil were bonded to each other without the Ti material being interposed therebetween, and thus the ceramic substrate and the Cu foil (circuit layer) could not be bonded to each other.

Example 3

Hereinafter, results of confirmation tests (Example 3) performed to confirm the effects of the embodiments of the present invention will be described.

Sheets of Cu—P—Sn-based brazing filler foil (37 mm×37 mm) with thicknesses shown in Table 3; Ti materials (37 mm×37 mm) with thicknesses shown in Table 3; and Cu foils (37 mm×37 mm×0.3 mm thickness) made of oxygen-free copper were sequentially laminated on first surfaces of ceramic substrates (40 mm×40 mm) shown in Table 3. When the material of the ceramic substrate was AlN, the thickness of the ceramic substrate was set to 0.635 mm, and when the material was $Si_3N_4$, the thickness was set to 0.32 mm. An Al plate (37 mm×37 mm×1.6 mm thickness) made of Al with a purity of 99.99% was laminated on a second surface of the ceramic substrate an Al—Si-based brazing filler material being interposed therebetween.

The ceramic substrate, the Cu—P—Sn-based brazing filler foil, the Ti material, the Cu foil, the Al—Si-based brazing filler material, and the Al plate, which were laminated on each other, were placed into and heated in a vacuum heating furnace while being pressurized at a pressure of 15 kgf/cm² (1.47 MPa) in a laminating direction. As a result, the Cu foil was bonded to the first surface of the ceramic substrate. Thereby, a circuit layer was formed. The Al plate was bonded to the second surface of the ceramic substrate, and thereby a metal layer was formed. The internal pressure of the vacuum heating furnace was set to be in a range of $10^{-6}$ Pa to $10^{-3}$ Pa, and the heating temperature and the heating time were set to the conditions shown in Table 3. As such, the power module substrates in Examples 3-1 to 3-13 of the present invention were obtained. In Examples 3-1 to 3-10, 3-12, and 3-13 of the present invention, Ti foil was used as the Ti material. In Example 3-11 of the present invention, a Ti film as the Ti material was formed on a bonding surface of the Cu foil by spattering.

A power module substrate in Comparative Example 3 was obtained using a method which was the same as that used to obtain the power module substrates in Examples 3-1 to 3-11 except the fact that the ceramic substrate and the circuit layer were bonded together without the Ti material being interposed therebetween.

The following measured for each of the power module substrates obtained in the aforementioned manner: the initial bonding rate between the circuit layer and the ceramic substrate; the bonding rate after the thermal cycle test; and the number of cycles of thermal cycle tests performed until the occurrence of cracking the ceramic substrate of the power module substrate.

In each of the obtained power module substrates, it was confirmed whether an intermetallic compound layer containing P and Ti was present at the bonded interface between the ceramic substrate and the circuit layer.

Similar to Example 2, the bonding rate was evaluated, the thermal cycle test was performed, and it was confirmed whether an intermetallic compound layer containing P and Ti was present.

Results of the aforementioned evaluations are shown in Table 3.

TABLE 3

|  | Components of Cu—P—Sn-based Brazing Filler Material | Thickness of Cu—P—Sn-based Brazing Filler Material μm | Melting Point of Cu—P—Sn-based Brazing Filler Material | Thickness of Ti Material μm |
|---|---|---|---|---|
| Example 3-1 | Cu-6.3 mass % of P-9.3 mass % of Sn-7 mass % of Ni | 20 | 600° C. | 3 |
| Example 3-2 | Cu-7 mass % of P-15 mass % of Sn-10 mass % of Ni | 20 | 580° C. | 0.3 |
| Example 3-3 | Cu-7 mass % of P-15 mass % of Sn-10 mass % of Ni | 20 | 580° C. | 0.3 |
| Example 3-4 | Cu-7 mass % of P-15 mass % of Sn-10 mass % of Ni | 20 | 580° C. | 0.5 |
| Example 3-5 | Cu-7 mass % of P-15 mass % of Sn-10 mass % of Ni | 20 | 580° C. | 1 |
| Example 3-6 | Cu-7 mass % of P-15 mass % of Sn-10 mass % of Ni | 20 | 580° C. | 3 |

TABLE 3-continued

| | | | | |
|---|---|---|---|---|
| Example 3-7 | Cu-7 mass % of P-15 mass % of Sn-10 mass % of Ni | 20 | 580° C. | 5 |
| Example 3-8 | Cu-7 mass % of P-15 mass % of Sn-10 mass % of Ni | 20 | 580° C. | 1 |
| Example 3-9 | Cu-7 mass % of P-15 mass % of Sn-10 mass % of Ni | 20 | 580° C. | 2 |
| Example 3-10 | Cu-6.3 mass % of P-9.3 mass % of Sn-7 mass % of Ni | 20 | 600° C. | 3 |
| Example 3-11 | Cu-7 mass % of P-15 mass % of Sn-10 mass % of Ni | 20 | 580° C. | 0.3 |
| Example 3-12 | Cu-7 mass % of P-15 mass % of Sn-5 mass % of Mn | 20 | 580° C. | 3 |
| Example 3-13 | Cu-7 mass % of P-15 mass % of Sn-7 mass % of Cr | 20 | 580° C. | 3 |
| Comparative Example 3 | Cu-7 mass % of P-15 mass % of Sn-10 mass % of Ni | 20 | 580° C. | — |

| | Material of Ceramic Substrate | Heating Conditions Temperature | Heating Conditions Time | Existence of Intermetallic Compound Layer Containing P and Ti | Initial Bonding Rate % | Bonding Rate After Thermal Cycle % | Cracking in Ceramic Substrate Number of Thermal Cycles |
|---|---|---|---|---|---|---|---|
| Example 3-1 | AlN | 650° C. | 180 min. | Yes | 98.7 | 97.8 | >2000 |
| Example 3-2 | AlN | 650° C. | 240 min. | Yes | 99.7 | 96.1 | >2000 |
| Example 3-3 | AlN | 650° C. | 240 min. | Yes | 98.3 | 95.7 | >2000 |
| Example 3-4 | AlN | 650° C. | 240 min. | Yes | 99.6 | 98.2 | >2000 |
| Example 3-5 | AlN | 650° C. | 240 min. | Yes | 99.4 | 98.3 | >2000 |
| Example 3-6 | AlN | 650° C. | 240 min. | Yes | 99.6 | 98.4 | >2000 |
| Example 3-7 | AlN | 650° C. | 240 min. | Yes | 98.9 | 97.2 | 1500-2000 |
| Example 3-8 | AlN | 630° C. | 60 min. | Yes | 96.7 | 94.0 | >2000 |
| Example 3-9 | AlN | 600° C. | 360 min. | Yes | 98.5 | 95.1 | >2000 |
| Example 3-10 | $Si_3N_4$ | 650° C. | 180 min. | Yes | 97.9 | 93.9 | >2000 |
| Example 3-11 | $Si_3N_4$ | 650° C. | 240 min. | Yes | 98.2 | 94.1 | >2000 |
| Example 3-12 | AlN | 650° C. | 240 min. | Yes | 99.3 | 97.2 | >2000 |
| Example 3-13 | AlN | 650° C. | 240 min. | Yes | 99.5 | 98.8 | >2000 |
| Comparative Example 3 | AlN | 650° C. | 90 min. | No | 0.0 | — | — |

As shown in Table 3, in Examples 3-1 to 3-13 of the present invention, the ceramic substrate and the Cu foil were bonded to each other with the Cu—P—Sn-based brazing filler material and the material being interposed therebetween, and thus it was confirmed that the initial bonding rate between the ceramic substrate and the circuit layer was high, and the ceramic substrate and the circuit layer were sufficiently bonded to each other. In Examples 3-1 to 3-13 of the present invention, it was confirmed that the bonding rate after the thermal cycle test was high, and the reliability of bonding was high. In Examples 3-1 to 3-13 of the present invention, it was confirmed that the number of cycles of thermal cycle tests, which were performed until the occurrence of cracking in the ceramic substrate, was large, and cracking was unlikely to occur in the ceramic substrate.

In contrast, in Comparative Example 3, the ceramic substrate and the Cu foil were bonded to each other without the Ti material being interposed therebetween and thus the ceramic substrate and the Cu foil (circuit layer) could not be bonded to each other.

Example 4

Hereinafter, results of confirmation tests (Example 4) performed to confirm the effects of the embodiments of the present invention will be described.

Sheets of Cu—P—Sn-based brazing filler material (37 mm×37 mm) with thicknesses shown in Table 4; Ti materials (37 mm×37 mm) with thicknesses shown in Table 4; and Cu foils (37 mm×37 mm×0.3 mm thickness) made of oxygen-free copper were sequentially laminated on first surfaces of ceramic substrates (40 mm×40 mm) shown in Table 4. When the material of the ceramic substrate was AlN, the thickness of ceramic substrate was set to 0.635 mm, and when the material was $Si_3N_4$, the thickness was set to 0.32 mm. A Ti film as Ti material was formed on a bonding surface of the Cu foil by spattering.

While being pressurized at a pressure of 15 kgf/cm² (1.47 MPa) in a laminating direction, the ceramic substrate, the Cu—P—Sn-based brazing filler material, the Ti material, and the Cu foil, which were laminated on each other, were placed into and heated in a vacuum heating furnace. Thereby, the Cu foil was bonded to the first surface of the ceramic substrate, and a circuit layer was formed. The internal pressure of the vacuum heating furnace was set to be in a range of $10^{-6}$ Pa to $10^{-3}$ Pa, and the heating temperature and the heating time were set to the conditions shown in Table 4. As such, the power module substrates in Examples 4-1 to 4-8 of the present invention were obtained.

(Etching Test)

In an etching test, the circuit layer of each of the obtained power module substrates was etched in an aqueous etching solution of ferric chloride (III) for an etching time of 10 minutes in such a way that predetermined circuit patterns were formed.

Quantitative analyses were performed on each of surfaces between the circuit patterns on the circuit layer (on which the predetermined circuit patterns were formed) using EPMA, and the total amount of Ti and the components (for example, Cu, P, Sn, Ni in Example 4-1 of the present invention) of the brazing filler material was measured. The measurement was performed at 10 locations, and the average value of the measurements was deemed to be the total amount. When the total amount was less than 0.2 at %, the surface was evaluated as "A", when the total amount was 0.2 at % to less than 0.4 at %, the surface was evaluated as "B", and when the total amount was 0.4 at % or greater, the surface was evaluated as "C".

Results of the aforementioned evaluations are shown in Table 4.

TABLE 4

| | Cu—P—Sn-based Brazing Filler Material | | Thickness of Ti Material | Type of Ceramic Substrate | Heating Conditions | | Existence of Intermetallic Compound Layer Containing P and Ti | Etching Test Result |
|---|---|---|---|---|---|---|---|---|
| | Components | Thickness μm | Melting Point | μm | | Temperature | Time | | |
| Example 4-1 | Cu-6.3 mass % of P-9.3 mass % of Sn-7 mass % of Ni | 20 | 600° C. | 0.3 | AlN | 650° C. | 60 min. | Yes | A |
| Example 4-2 | Cu-7 mass % of P-15 mass % of Sn-10 mass % of Ni | 20 | 580° C. | 0.1 | AlN | 650° C. | 60 min. | Yes | A |
| Example 4-3 | Cu-7 mass % of P-15 mass % of Sn-10 mass % of Ni | 20 | 580° C. | 0.2 | AlN | 650° C. | 60 min. | Yes | A |
| Example 4-4 | Cu-7 mass % of P-15 mass % of Sn-10 mass % of Ni | 20 | 580° C. | 0.3 | AlN | 650° C. | 60 min. | Yes | A |
| Example 4-5 | Cu-7 mass % of P-15 mass % of Sn-10 mass % of Ni | 20 | 580° C. | 0.5 | AlN | 650° C. | 60 min. | Yes | B |
| Example 4-6 | Cu-7 mass % of P-15 mass % of Sn-5 mass % of Mn | 20 | 580° C. | 0.3 | AlN | 650° C. | 60 min. | Yes | A |
| Example 4-7 | Cu-7 mass % of P-15 mass % of Sn-7 mass % of Cr | 20 | 580° C. | 0.3 | AlN | 650° C. | 60 min. | Yes | A |
| Example 4-8 | Cu-7 mass % of P-15 mass % of Sn-10 mass % of Ni | 20 | 580° C. | 0.1 | $Si_3N_4$ | 650° C. | 60 min. | Yes | A |

As shown in Table 4. Examples 4-1 to 4-8 of the present invention, it was confirmed that etching properties were good based on the fact that the thickness of the Ti material was less than 0.5 μm.

INDUSTRIAL APPLICABILITY

In the bonded body and the power module substrate of the present invention, the ceramic member and the Cu member can be sufficiently bonded to each other, and when the bonded body and the power module substrate undergo a thermal cycle, the occurrence of cracking in the ceramic member can be limited. For this reason, the bonded body and the power module substrate of the present invention are suitably used in a power module under severe operating environments, for example, a high-power control power semiconductor element used to control wind power generation systems and electric vehicles such as electric automobiles.

REFERENCE SIGNS LIST

10, 110, 210, 310: POWER MODULE SUBSTRATE (BONDED BODY)
11: CERAMIC SUBSTRATE (CERAMIC MEMBER)
12, 112, 212, 312: CIRCUIT LAYER (Cu MEMBER)
14, 114: Cu—Sn LAYER
17, 117, 317: INTERMETALLIC COMPOUND LAYER
22, 122, 123, 222, 322: Cu FOIL (Cu MEMBER)

The invention claimed is:

1. A bonded body comprising:
a ceramic member made of ceramics; and
a Cu member which is made of Cu or a Cu alloy and bonded to the ceramic member through a Cu—P—Sn-based brazing filler material and a Ti material,
wherein a Cu—Sn layer, which is positioned close to the ceramic member and in which Sn forms a solid solution with Cu, and an intermetallic compound layer which is positioned between the Cu member and the Cu—Sn layer and contains P and Ti, are formed at a bonded interface between the ceramic member and the Cu member.

2. The bonded body according to claim 1,
wherein the intermetallic compound layer is formed in a range of 0.1 μm to 100 μm from the interface between the ceramic member and the Cu—Sn layer.

3. A power module substrate comprising the bonded body according to claim 2, wherein the substrate further comprises:
a ceramic substrate formed of the ceramic member; and
a circuit layer formed by bonding a Cu foil formed of the Cu member to a first surface of the ceramic substrate through the Cu—P—Sn-based brazing filler material and the Ti material, and
wherein the Cu—Sn layer, which is positioned close to the ceramic substrate and in which Sn forms a solid solution with Cu, and the intermetallic compound layer which is positioned between the circuit layer and the Cu—Sn layer and contains P and Ti, are formed at a bonded interface between the ceramic substrate and the circuit layer.

4. The power module substrate according to claim 3,
wherein a metal layer is formed on a second surface of the ceramic substrate.

5. The power module substrate according to claim 4,
wherein the metal layer is formed by bonding a Cu foil made of Cu or a Cu alloy to the second surface of the ceramic substrate through a Cu—P—Sn-based brazing filler material and a Ti material, and
wherein a Cu—Sn layer, which is positioned close to the ceramic substrate and in which Sn forms a solid solution with Cu, and an intermetallic compound layer which is positioned between the metal layer and the Cu—Sn layer and contains P and Ti, are formed at a bonded interface between the ceramic substrate and the metal layer.

6. The power module substrate according to claim 4,
wherein the metal layer is made of Al or an Al alloy.

7. A power module substrate comprising the bonded body according to claim 1, wherein the substrate further comprises:
- a ceramic substrate formed of the ceramic member; and
- a circuit layer formed by bonding a Cu foil formed of the Cu member to a first surface of the ceramic substrate through the Cu—P—Sn-based brazing filler material and the Ti material, and
- wherein the Cu—Sn layer, which is positioned close to the ceramic substrate and in which Sn forms a solid solution with Cu, and the intermetallic compound layer which is positioned between the circuit layer and the Cu—Sn layer and contains P and Ti, are formed at a bonded interface between the ceramic substrate and the circuit layer.

8. The power module substrate according to claim 7, wherein a metal layer is formed on a second surface of the ceramic substrate.

9. The power module substrate according to claim 8, wherein the metal layer is formed by bonding a Cu foil made of Cu or a Cu alloy to the second surface of the ceramic substrate through a Cu—P—Sn-based brazing filler material and a Ti material, and
- wherein a Cu—Sn layer, which is positioned close to the ceramic substrate and in which Sn forms a solid solution with Cu, and an intermetallic compound layer which is positioned between the metal layer and the Cu—Sn layer and contains P and Ti, are formed at a bonded interface between the ceramic substrate and the metal layer.

10. The power module substrate according to claim 8, wherein the metal layer is made of Al or an Al alloy.

* * * * *